(12) United States Patent  
Masuda

(10) Patent No.: US 7,061,118 B2
(45) Date of Patent: Jun. 13, 2006

(54) SEMICONDUCTOR DEVICE, STACKED SEMICONDUCTOR DEVICE, METHODS OF MANUFACTURING THE SAME, CIRCUIT BOARD, AND ELECTRONIC INSTRUMENT

(75) Inventor: Kazuhiro Masuda, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 12 days.

(21) Appl. No.: 10/836,200

(22) Filed: May 3, 2004

(65) Prior Publication Data

US 2005/0001326 A1 Jan. 6, 2005

(30) Foreign Application Priority Data

May 6, 2003 (JP) ............................. 2003-128077
Feb. 17, 2004 (JP) ............................. 2004-040082

(51) Int. Cl.
*H01L 23/48* (2006.01)
(52) U.S. Cl. ............... 257/774; 257/191; 257/197; 257/200; 257/592
(58) Field of Classification Search .......... 257/191, 257/197, 200, 592
See application file for complete search history.

(56) References Cited

U.S. PATENT DOCUMENTS

| 6,608,371 | B1 | 8/2003 | Kurashima et al. | |
| 6,756,671 | B1* | 6/2004 | Lee et al. | 257/737 |
| 6,828,602 | B1* | 12/2004 | Asai et al. | 257/197 |

FOREIGN PATENT DOCUMENTS

| JP | A 2000-031145 | 1/2000 |
| JP | A 2001-044357 | 2/2001 |
| JP | A 2002-50738 | 2/2002 |
| JP | A 2003-017558 | 1/2003 |
| JP | A 2003-086589 | 3/2003 |

* cited by examiner

*Primary Examiner*—Mai-Huong Tran
(74) *Attorney, Agent, or Firm*—Oliff & Berridge, PLC

(57) ABSTRACT

A method of manufacturing a semiconductor device having a connection terminal and a substrate on which a circuit section and an electrode are stacked in this order, the circuit section having a multilayer interconnect structure, the electrode being conductively connected to the circuit section, and the connection terminal penetrating the substrate and being conductively connected to the electrode. Part of the connection terminal is formed simultaneously with an interconnect in an interconnect layer of the circuit section.

10 Claims, 20 Drawing Sheets

SEMICONDUCTOR DEVICE, STACKED SEMICONDUCTOR DEVICE, METHODS OF MANUFACTURING THE SAME, CIRCUIT BOARD, AND ELECTRONIC INSTRUMENT

Japanese Patent Application No. 2003-128077, filed on May 6, 2003, and Japanese Patent Application No. 2004-40082, filed on Feb. 17, 2004, are hereby incorporated by reference in their entirety.

BACKGROUND OF THE INVENTION

The present invention relates to a semiconductor device and a stacked semiconductor device suitable for use in a three-dimensional mounting technology, methods of manufacturing them, and a circuit board and an electronic instrument including these semiconductor devices.

In order to reduce the size and weight of a portable electronic instrument such as a portable telephone, notebook-type personal computer, or personal data assistant (PDA), electronic parts provided in the electronic instrument, such as a semiconductor chip, have been reduced in size. Moreover, space for mounting the electronic parts is extremely limited. Therefore, the packaging method for the semiconductor chip has been developed, and an extremely small package called a chip scale package (CSP) has been proposed.

Since the mounting area necessary for the semiconductor chip manufactured by using the CSP technology is approximately the same as the area of the semiconductor chip, high-density mounting can be achieved.

However, since the above electronic instrument is expected to be further reduced in size and increased in function, it is necessary to further increase the mounting density of the semiconductor chip.

In view of the above situation, a three-dimensional mounting technology as disclosed in Japanese Patent Application Laid-open No. 2002-50738 has been proposed. This three-dimensional mounting technology increases the mounting density by stacking semiconductor chips having the same function, or by stacking semiconductor chips having different functions, and interconnecting the semiconductor chips.

A semiconductor chip used in the three-dimensional mounting technology includes a connection terminal penetrating the substrate. The chips are electrically connected by stacking the chips through the connection terminals. Conventionally, such a connection terminal is generally processed in a post-processing step after completing the wafer process (from the multilayer interconnection step to the passivation film formation step). This method can be widely used since various devices can be additionally processed. However, such an additional step increases cost.

BRIEF SUMMARY OF THE INVENTION

According to a first aspect of the present invention, there is provided a method of manufacturing a semiconductor device having a connection terminal and a substrate on which a circuit section and an electrode are stacked in this order, the circuit section having a multilayer interconnect structure, the electrode being conductively connected to the circuit section, and the connection terminal penetrating the substrate and being conductively connected to the electrode, the method comprising:

an insulating film formation step of forming an insulating film on the substrate;

a hole formation step of forming a plurality of connection holes in the insulating film at a position corresponding to a connection terminal formation region, and then forming a recess in the insulating film in a region including part of the connection holes;

a groove formation step of forming an interconnect groove in the substrate avoiding the connection terminal formation region; and a conductive material filling step of filling the connection holes, the recess, and the groove with a conductive material, wherein an interconnect layer of the circuit section and the connection terminal are stacked in a direction of the thickness of the substrate by repeatedly performing the insulating film formation step, the hole formation step, the groove formation step, and the conductive material filling step.

According to a second aspect of the present invention, there is provided a method of manufacturing a stacked semiconductor device, comprising:

stacking a plurality of semiconductor devices manufactured by the above-described method with the connection terminal interposed.

According to a third aspect of the present invention, there is provided a semiconductor device comprising:

a substrate on which an electrode is formed; and a connection terminal which penetrates the substrate and is conductively connected to the electrode, wherein the connection terminal includes:

a plurality of conductive layers disposed in layers in a direction of the thickness of the substrate; and a plurality of connection layers which have a plurality of connection holes to conductively connect the conductive layers adjacent to each other.

According to a fourth aspect of the present invention, there is provided a stacked semiconductor device, wherein a plurality of the above-described semiconductor devices are stacked with the connection terminal interposed.

A circuit board according to a fifth aspect of the present invention comprises the above semiconductor device, and an electronic instrument according to a sixth aspect of the present invention comprises the circuit board.

DETAILED DESCRIPTION OF THE EMBODIMENT

Figure 1:
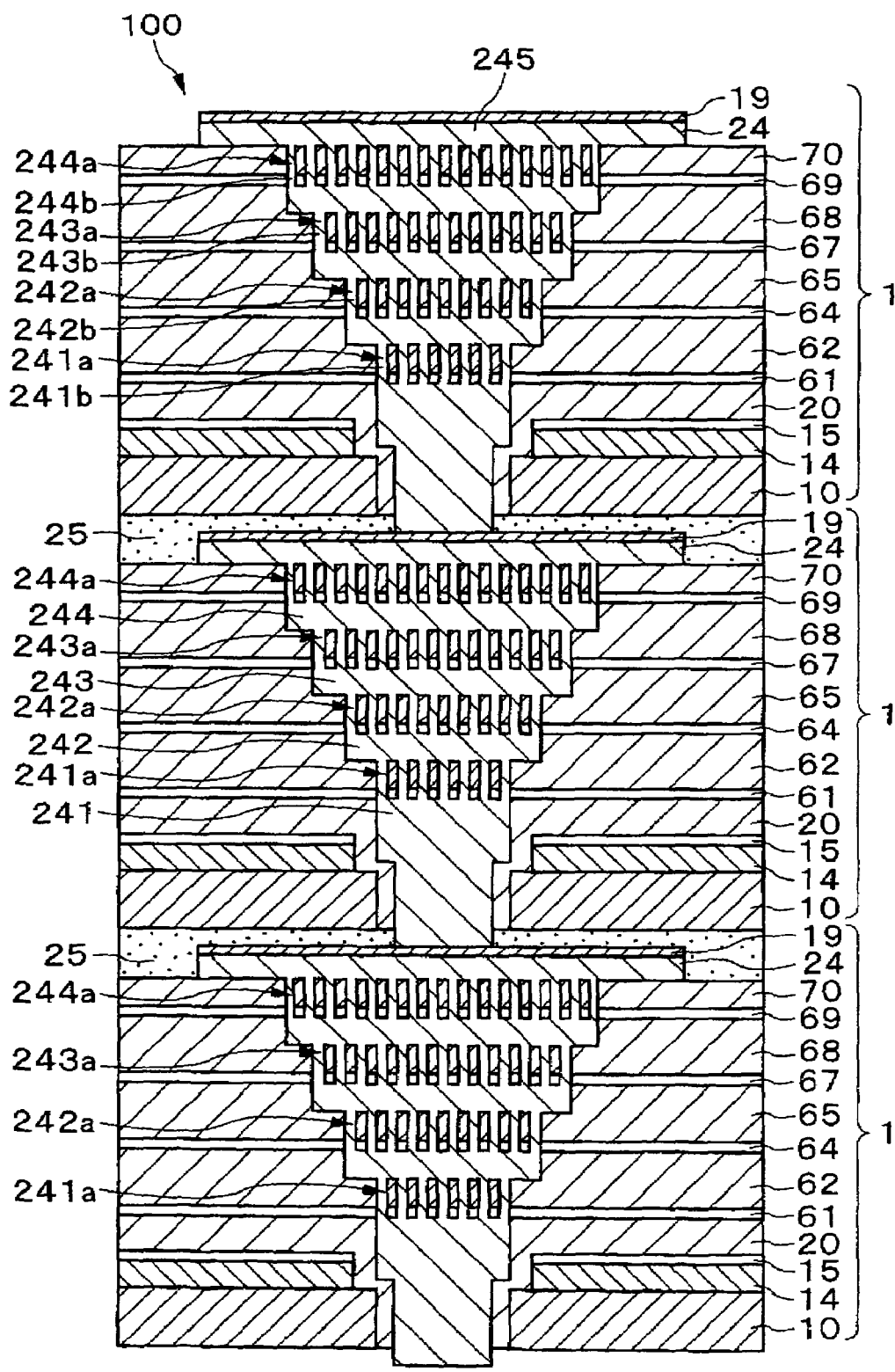
FIG. 1 is a schematic cross-sectional view of a semiconductor device according to a first embodiment of the present invention.

Embodiments of the present invention are achieved in view of the above-described problems, and may provide a method of manufacturing a semiconductor device which enables the manufacturing cost to be reduced by simplifying formation steps of a conductive material.

According to one embodiment of the present invention, there is provided a method of manufacturing a semiconductor device having a connection terminal and a substrate on which a circuit section and an electrode are stacked in this order, the circuit section having a multilayer interconnect structure, the electrode being conductively connected to the circuit section, and the connection terminal penetrating the substrate and being conductively connected to the electrode, the method comprising:

an insulating film formation step of forming an insulating film on the substrate;

a hole formation step of forming a plurality of connection holes in the insulating film at a position corresponding to a connection terminal formation region, and then forming a recess in the insulating film in a region including part of the connection holes;

a groove formation step of forming an interconnect groove in the substrate avoiding the connection terminal formation region; and a conductive material filling step of filling the connection holes, the recess, and the groove with a conductive material, wherein an interconnect layer of the circuit section and the connection terminal are stacked in a direction of the thickness of the substrate by repeatedly performing the insulating film formation step, the hole formation step, the groove formation step, and the conductive material filling step.

According to this manufacturing method, the connection holes and the recess connected with the connection holes are formed in the connection terminal formation region on the substrate and the interconnect groove is formed at a position differing from the connection holes, by performing a series of steps including the insulating film formation step, the hole formation step, and the groove formation step. The recess, the connection holes, and the groove are then filled with the conductive material by the conductive material filling step, whereby a conductive layer, a connection layer, and an interconnect are formed. The conductive layer is formed by filling the recess with the conductive material. The connection layer is formed by filling a plurality of connection holes with the conductive material and so conductively connected to the conductive layer. The conductive layer and the connection layer form part of the connection terminal. Specifically, part of the connection terminal and the interconnect in the circuit section are simultaneously formed in the direction of the thickness of the substrate by a series of steps from the insulating film formation step to the conductive material filling step. By repeating these steps, the conductive layer and the connection layer are added while the interconnect in each layer is being formed. The adjacent conductive layers are conductively connected through the connection holes in the connection layer disposed between the conductive layers, and the connection terminal penetrating the substrate is formed of the conductive layers and the connection layers provided in layers.

Therefore, according to this manufacturing method, since the connection terminal is formed when forming the circuit section, the steps can be simplified in comparison with a conventional method in which the formation steps of the connection terminal are performed after the formation steps of the circuit section, whereby cost can be reduced. Moreover, since this method can reduce the formation time of the conductive material disposed in at least the insulating film in comparison with a conventional method, the process time can be reduced as the number of layers in the circuit section is increased (as the thickness of the insulating film formed on the substrate is increased), whereby the manufacturing cost can be reduced. In this method, since the conductive layers which make up the connection terminal are conductively connected through the connection holes, mechanical stability and electrical stability of the vertical connection can be increased.

In the hole formation step, the connection holes may be formed at positions differing from other connection holes which are formed in a lower layer adjacent to the connection holes with the conductive material interposed. This enables mechanical stability of connection between the conductive layers to be further improved.

In the hole formation step, the connection holes may be formed to be arranged along the periphery of the conductive material connected to the connection holes. In the conductive material filling step, after forming the conductive material in the recess, the connection holes, and the groove by using a plating method, a depositing method, or the like, an excess conductive material is removed by polishing using a chemical mechanical polishing (CMP) method or the like. The connection terminal, that is, the conductive layer has a diameter as large as several tens of microns. Therefore, when the conductive layer having such a large diameter is polished, the center of the conductive layer is depressed to some extent after polishing due to the difference in selectivity ratio between the periphery of the conductive layer and the center of the conductive layer. If the connection holes are formed at the center of the conductive layer, separation tends to occur in this area due to external stress or the like, whereby mechanical stability and electrical stability of vertical connection may be impaired. Therefore, reliability of the semiconductor device can be increased by disposing the connection holes so as to avoid the center of the conductive layer.

In the above-described configuration in which the connection holes are disposed along the periphery of the conductive material, it is preferable to form a recess larger than another recess adjacently disposed in the lower layer in the hole formation step. In this case, the connection holes disposed in one connection layer are inevitably disposed at positions differing from connection holes formed in another connection layer adjacent to this connection layer as viewed from a direction perpendicular to the substrate. Therefore, the degrees of freedom relating to design, such as the size and interval of the connection holes disposed in one connection layer, can be increased while maintaining reliability of the device.

The groove formation step may include forming an interconnection hole used to connect an interconnect in the interconnect layer to an interconnect in a lower interconnect layer; and the connection holes, the recess, the groove and the interconnection hole may be filled with the conductive material in the conductive material filling step. This enables to further improve efficiency because the interconnect, the conductive layer, and the connection layer can be formed corresponding to each interconnect layer and a connection plug which connects the interconnect to an interconnect of a lower interconnect layer can be formed at the same time.

Moreover, a three-dimensional mounting type semiconductor device having a small size and high reliability can be manufactured by stacking the semiconductor devices manufactured by the above-described method with the connection terminals interposed.

In the above manufacturing method, the hole formation step and the groove formation step may be performed in an arbitrary order. In the hole formation step, the formation of the connection hole and the formation of the recess may be performed in an arbitrary order.

According to one embodiment of the present invention, there is provided a semiconductor device comprising:

a substrate on which an electrode is formed; and a connection terminal which penetrates the substrate and is conductively connected to the electrode, wherein the connection terminal includes:

a plurality of conductive layers disposed in layers in a direction of the thickness of the substrate; and a plurality of connection layers which have a plurality of connection holes to conductively connect the conductive layers adjacent to each other.

According to this configuration, since the conductive layers which make up the connection terminal are conductively connected through the connection holes, a semiconductor device having high mechanical stability and electrical stability of vertical connection and having high reliability can be implemented.

As viewed from a direction perpendicular to the substrate, positions of the connection holes in the connection layer may not coincide with positions of other connection holes disposed in another connection layer adjacent to the connection layer. This further increases mechanical stability of vertical connection.

The conductive layers may be disposed in layers so that a lower conductive layer is disposed within an upper conductive layer as viewed from a direction perpendicular to the substrate; and the connection holes in the connection layer may be arranged along the periphery of one of the conductive layers which is disposed under the connection layer. In this case, the connection holes disposed in one connection layer are inevitably disposed at a position differing from connection holes formed in the adjacent connection layer as viewed from a direction perpendicular to the substrate. This enables to improve the degrees of freedom relating to design of the connection holes disposed in one connection layer while maintaining the reliability of the device.

An uppermost conductive layer in the conductive layers of the connection terminal may be formed to function as an electrode. This enables substrate space to be saved in comparison with the case where the connection terminal is formed on the substrate in the region in which the electrode is not formed, whereby an increase in function and a reduction of size of the semiconductor device can be implemented.

Part of the connection terminal may project from a surface of the substrate opposite to the surface on which the electrode is provided. This enables electrical connection with the outside to be easily achieved by using the projecting section. In more detail, a three-dimensional mounting type (stacked) semiconductor device can be implemented by stacking such semiconductor devices with the connection terminals interposed.

A circuit board according to one embodiment of the present invention comprises the above-described semiconductor device, and an electronic instrument according to one embodiment of the present invention comprises the circuit board. This enables a circuit board and an electronic instrument having high mechanical and electrical reliability to be provided.

The embodiments of the present invention are described in detail with reference to the drawings. Note that the components in the embodiments of the present invention are scaled so that they have a size recognizable in the drawings.

FIG. 1 is a cross-sectional view showing main components of a three-dimensional mounting type semiconductor device according to a first embodiment of the present invention. A three-dimensional mounting type semiconductor device 100 has a configuration in which a plurality of semiconductor chips 1 (semiconductor devices) in which a circuit section is formed on a silicon substrate 10 are stacked.

The circuit section of the semiconductor chip 1 has a multilayer interconnect structure (four-layer structure in FIG. 1, for example). In the semiconductor chip 1, a connection terminal 24, which is formed through the substrate 10 and the circuit section in the stacking direction, is provided at a position at which a device and an interconnect are not formed in the circuit section.

The connection terminal 24 includes a plurality of conductive layers 241, 242, 243, 244, and 245 provided in layers in the direction of the thickness of the substrate 10 corresponding to each interconnect layer in the circuit section. The adjacent conductive layers are conductively connected through connection layers 241a, 242a, 243a, and 244a. A plurality of connection holes 241b, 242b, 243b, and 244b are respectively formed in the connection layers 241a, 242a, 243a, and 244a. For example, the connection holes 241b are formed in the connection layer 241a, and the adjacent conductive layers 241 and 242 are conductively connected through the connection holes 241b. The conductive layers 242 and 243, the conductive layers 243 and 244, and the conductive layers 244 and 245 are conductively connected at a plurality of points through the connection holes 242b, 243b, and 244b, respectively.

An uppermost surface of the connection terminal 24 on the substrate (or the uppermost conductive layer 245 exposed from the circuit section) is formed as an electrode pad. The pad 245 is electrically connected with the circuit section at a position not shown in FIG. 2. An electrical signal generated in the chip is output to another chip stacked thereon through the pad 245. In this embodiment, an interconnect material for the circuit section is used as the material for the connection terminal 24. A low resistance metal material such as aluminum, gold, silver, copper, or platinum may be suitably used for such a conductive material.

A plating thin film 19 made of tin-silver is formed on the upper surface of the connection terminal. Another semiconductor chip is stacked and connected through the plating thin film 19. In the semiconductor chip 1, the connection terminal 24 is formed to project from the back surface of the silicon substrate 10. The projecting section is connected with the connection terminal of another semiconductor device through the plating thin film. The space between the stacked chips 1 is filled with an underfill 25.

An example of a method of manufacturing the semiconductor device shown in FIG. 1 is described below. FIGS. 2A to 14 are cross-sectional views showing steps relating to the present invention among a series of steps for manufacturing the semiconductor device 100. FIGS. 2A to 5 are shown on a scale differing from FIGS. 6A to 14.

Formation steps of a device in the first layer in the circuit section and an interconnect layer conductively connected with the device are described below with reference to FIGS. 2A to 5. FIGS. 2A to 5 are enlarged views showing a part of the semiconductor chip 1 in each step.

Figure 2A:
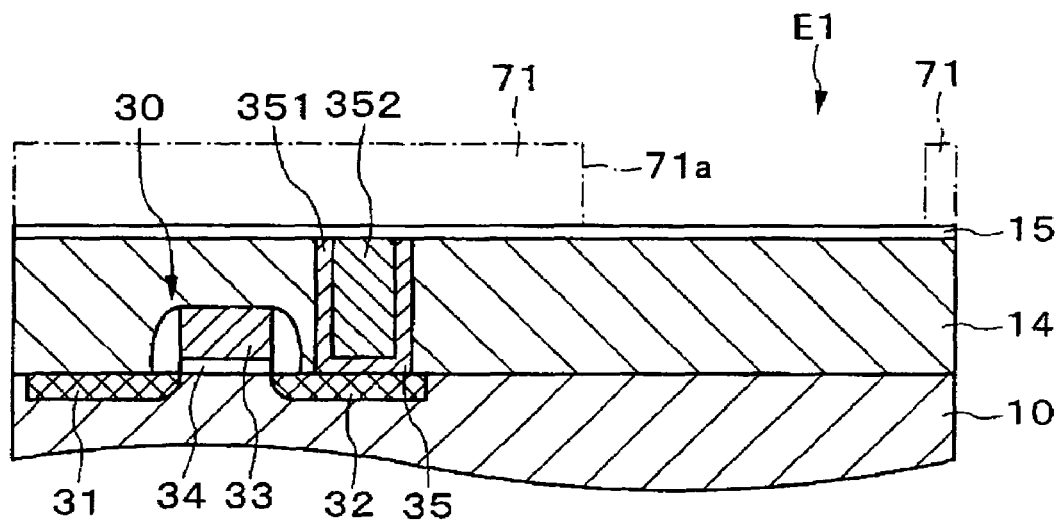
FIGS. 2A to 2C are schematic cross-sectional views each showing a step of a method of manufacturing the semiconductor device shown in FIG. 1.

As shown in FIG. 2A, the first layer including a circuit device such as a transistor 30 is formed on the substrate 10 such as a silicon substrate by using a conventional method. The transistor 30 includes a source section 31 and a drain section 32 in the substrate 10, and is formed by stacking a gate insulating film 34 and a gate section 33 on the substrate 10 in that order. A sidewall is formed on a sidewall section of the gate section 33, and a lightly doped drain (LDD) structure is implemented by doping with an impurity using the gate section 33 and the sidewall as a mask.

Figure 2B:
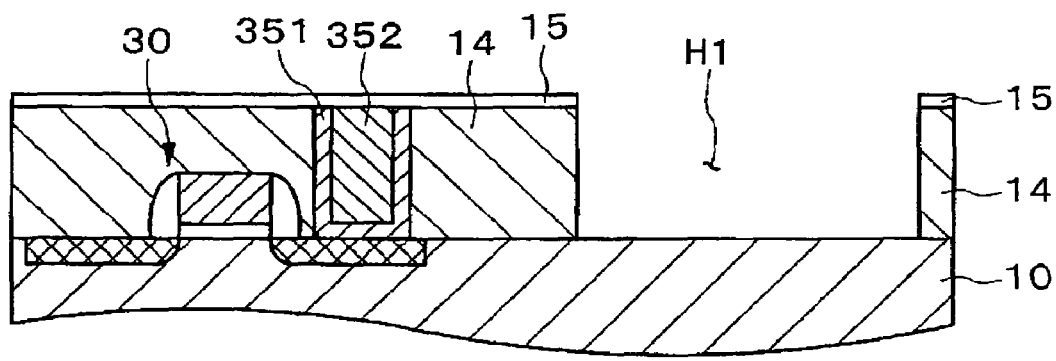

An insulating film 14 is formed of borophosphosilicate glass (hereinafter called "BPSG") on the first layer, for example. An interconnection hole 35 which reaches the drain section 32 of the transistor 30 is formed in the insulating film 14. The hole is filled with a tungsten plug 352. Another interconnection hole (not shown) which reaches the source section 31 of the transistor 30 may be formed in the insulating film 14 in the step of forming the interconnection hole 35 which reaches the drain section 32. The connection hole which reaches the source section 31 may be filled with a tungsten plug in the step of filling the interconnection hole 35 which reaches the drain section 32 with the tungsten plug 352. In FIGS. 2A and 2B, a TiN/Ti thin film which becomes a barrier layer is denoted by 351.

After forming the plug 352, an insulating film 15 having an etching rate differing from those of the insulating film 14 and a hard mask 29 formed in a step described later and having diffusion barrier properties for the material for the connection terminal 24 formed in a step described later is formed of silicon nitride, silicon carbide, or the like on the surface of the insulating film 14.

A resist 71 is applied to the insulating film 15 and patterned to form a hole 71a in a connection terminal formation region E1 (in which the connection terminal 24 is to be formed).

The shape of the hole 71a in the resist 71 is determined depending on the shape of a hole H1. For example, the resist 71 has a circular opening with a diameter of 60 µm.

Part of the insulating films 14 and 15 located under the hole 71a is removed by etching using the resist 71 as a mask. FIG. 2B is a cross-sectional view showing the state in which the resist 71 is removed by a removal treatment, ashing or the like after the above etching. The hole H1 is thus formed in the insulating films 14 and 15 under the hole 71a (in the connection terminal formation region E1).

Figure 2C:
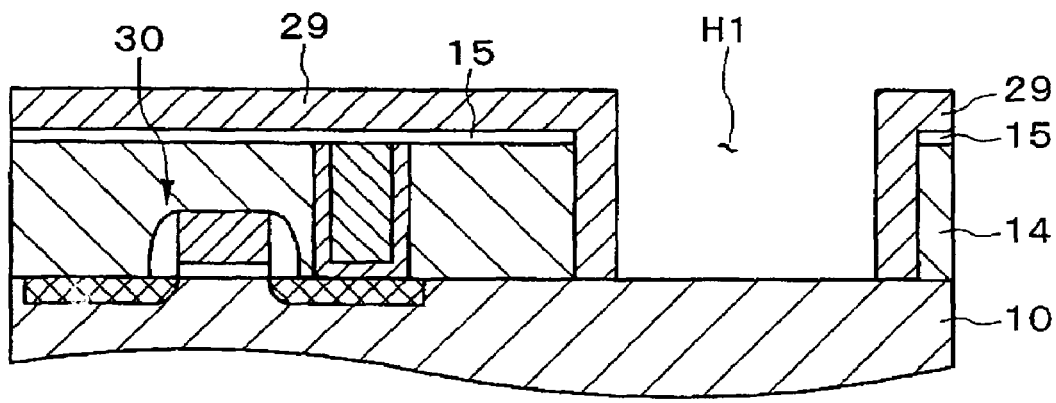

As shown in FIG. 2C, the etching hard mask 29 for forming a hole in the substrate 10 is formed. The hard mask 29 may be formed to cover the upper surface of the insulating film 15 and the inner surface of the hole H1. The hard mask 29 may be formed of an insulating material such as $SiO_2$ by using a CVD method, for example. After forming the hard mask 29 on the entire surface, part of the hard mask 29 at the bottom of the hole H1 is removed to expose the surface of the substrate 10 to the hole H1. It is preferable to apply dry etching. Dry etching may be reactive ion etching (RIE).

Figure 3A:
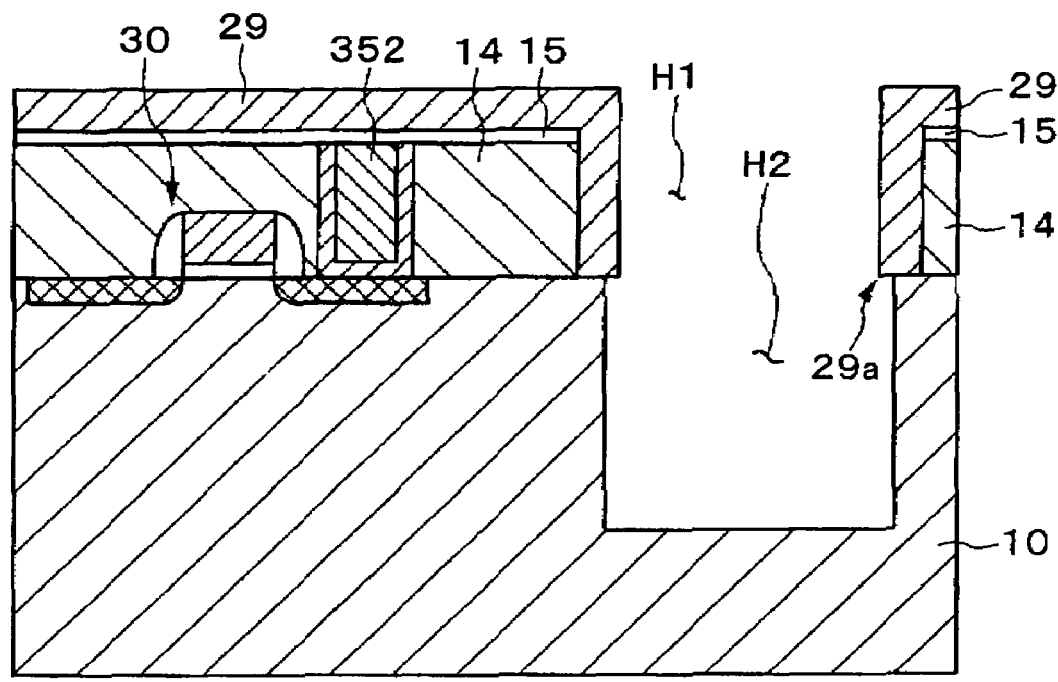
FIGS. 3A and 3B are schematic cross-sectional views each showing a step of the method of manufacturing the semiconductor device after the step of FIG. 2C.

As shown in FIG. 3A, a hole is formed in the substrate 10 by dry etching using the hard mask 29 having the opening. As dry etching, inductively coupled plasma (ICP) may be used instead of RIE. FIG. 3A is a cross-sectional view showing the state in which a hole H2 (substrate hole) is formed by forming a hole in the substrate 10. The diameter of the opening in the hard mask 29 is set at 30 µm taking over-etching (side-etching) when forming a hole in the substrate into consideration. In the case of forming a hole with a depth of about 70 µm in the substrate 10, it is necessary to form a silicon oxide film as the hard mask 29 to a thickness of about 2 µm by using tetraethyl orthosilicate ($Si(OC_2H_6)_4$: hereinafter called "TEOS") as a material and using plasma enhanced chemical vapor deposition (PECVD) (PE-TEOS method). As the formation method of the hard mask 29, an $O_3$-TEOS method in which a silicon oxide film is formed by using ozone and TEOS and using a thermal CVD method, or an $SiH_4$—$N_2O$ or $SiH_4$—$O_2$ plasma enhanced CVD method may be used instead of the PE-TEOS method. The thickness of the hard mask 29 is reduced by the substrate hole formation step. The thickness of the hard mask 29 is reduced to about 1000 to 9000 Å after the substrate hole formation step. In this embodiment, the thickness of the hard mask 29 is set to be greater than the amount of over-etching.

Since a conventional photo resist mask has poor dry etching resistance, a resist mask with a thickness of about 10 µm is necessary for forming a hole with a depth of 70 µm. This increases cost due to an increase in the thickness of the resist mask, and results in an inefficient process due to an increase in the aspect ratio. However, the film thickness can be reduced by using the hard mask 29, whereby an efficient manufacturing process can be implemented.

In this embodiment, the shape of an opening in the hard mask 29 is circular. However, the shape of the opening may be polygonal such as quadrangular. PFC dry etching or BHF wet etching is suitably used in the hole formation process.

Figure 3B:
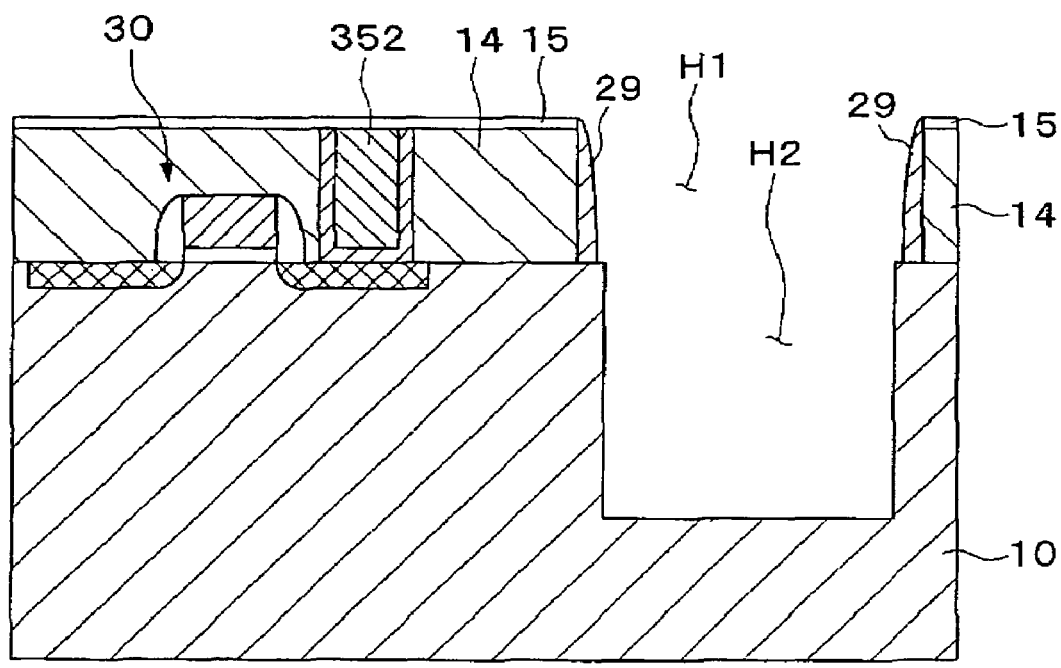

After the above-described steps are completed, the remaining hard mask 29 projects inward from the inner surface of the hole H2, thereby posing inconvenience in the subsequent process. Therefore, the hard mask 29 and a projecting section 29a are removed by etching the entire hard mask 29. In this case, it is preferable to use etching having a high selectivity ratio, that is, having a high etching rate for the hard mask 29 and the insulating film 14 and a low etching rate for the insulating film 15 so that etching stops at the insulating film 15, as shown in FIG. 3B. It is preferable to use anisotropic etching such as dry etching so that the thin film hard mask 29 remains on the inner walls of the insulating films 14 and 15, as shown in FIG. 3B.

Figure 4A:
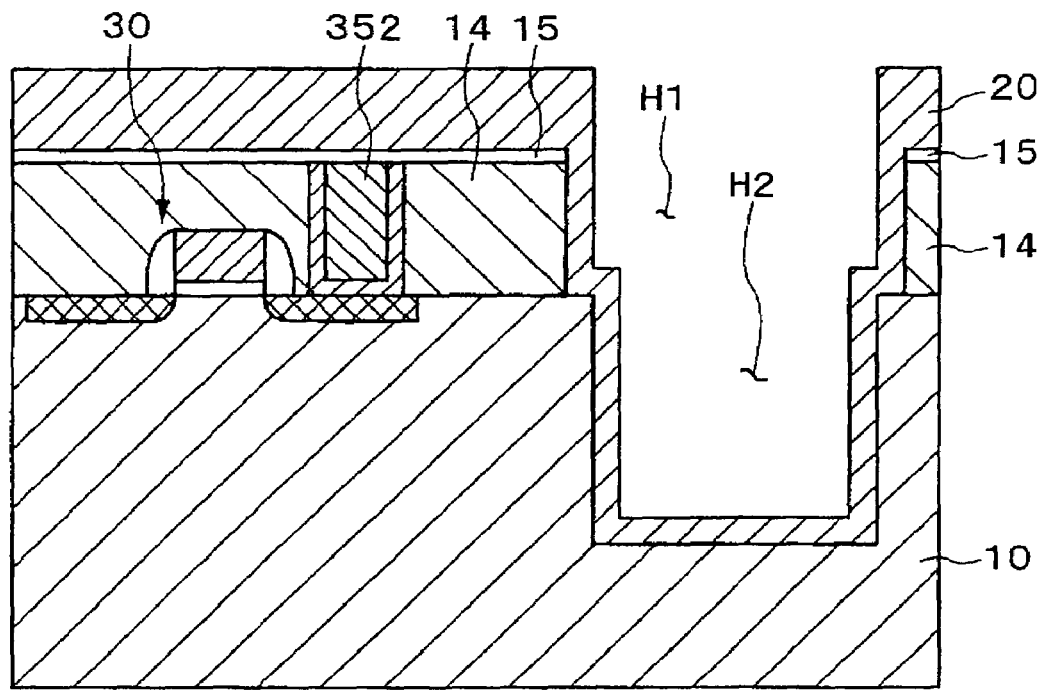
FIGS. 4A and 4B are schematic cross-sectional views each showing a step of the method of manufacturing the semiconductor device after the step of FIG. 3B.

The inner surface of the hole H2 is then covered with an insulating film. In this example, a silicon oxide film is formed to a thickness of about 1 to 3 μm by the PE-TEOS method. As a result, an insulating film 20 is formed on the inner surfaces of the holes H1 and H2 formed through the substrate 10 and the insulating films 14 and 15, as shown in FIG. 4A. The insulating film 20 may be a silicon nitride film which is formed to a thickness of about 1 to 3 μm by the plasma CVD method. The insulating film 20 may be formed by forming (stacking) the silicon oxide film and the silicon nitride film to a thickness of about 1 to 3 μm in total. In the case of forming the insulating film 20 by stacking the silicon oxide film and the silicon nitride film, the silicon oxide film may be formed at a position closer to the substrate 10 than the silicon nitride film by forming the silicon nitride film after forming the silicon oxide film. A thin film layer with a dielectric constant lower than that of the silicon oxide film 20 may be formed on the surface of the insulating film 20 disposed in the holes H1 and H2.

A resist (not shown) is applied to the insulating film 20. This resist is used to form a groove for an interconnect to be conductively connected with the plug 352 over the interconnection hole 35. After applying the resist, an opening (not shown) is formed by patterning at a position over a groove formation region E2 above the interconnection hole 35. Part of the insulating films 15 and 20 located under the opening are removed by etching using the resist as a mask, thereby exposing the surface of the connection plug 352 to the opening. This allows an interconnect groove 28 to be formed over the interconnection hole 35, as shown in FIG. 4B.

Figure 4B:
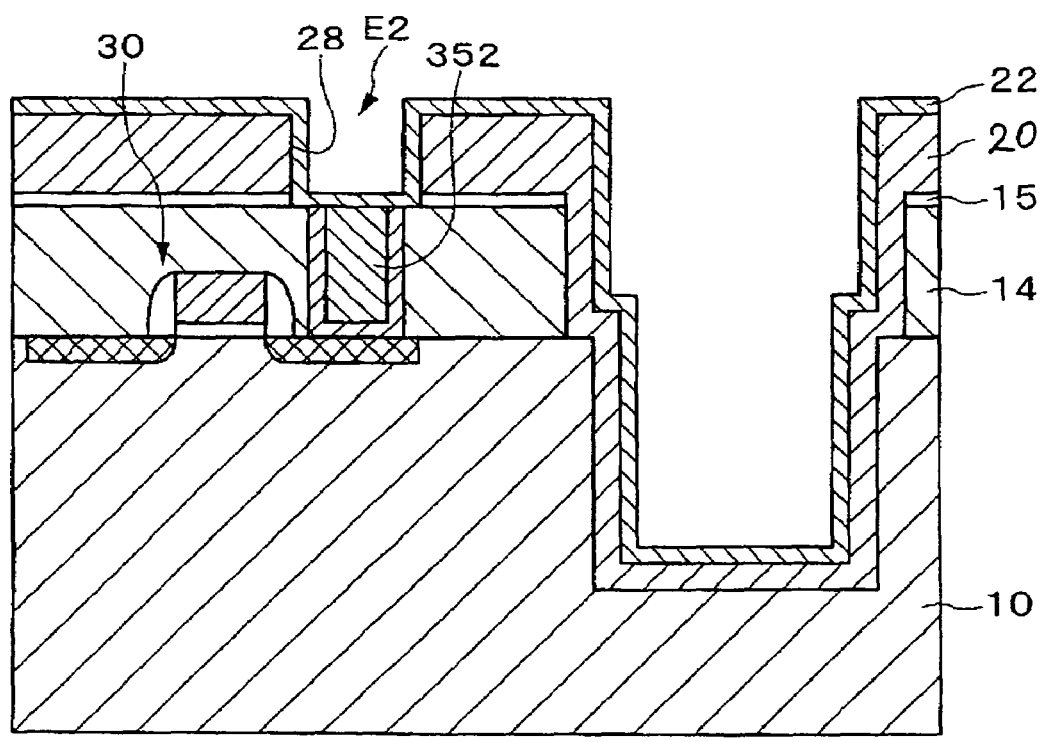

After removing the resist for forming the groove 28, a base film 22 including a barrier layer and a seed layer is formed on the substrate, as shown in FIG. 4B. A metal such as TiN, TaN, or WN (tungsten nitride) is used as a material for the barrier layer. The seed layer is formed of a material which is the same as the material of the connection terminal 24, such as copper. As the formation method of the barrier layer and the seed layer, a sputtering method, a CVD method, or the like may be used. This allows the base film 22 to be formed on the insulating film 20 while sufficiently covering the inner surfaces of the groove 28 and the holes H1 and H2.

Figure 5:
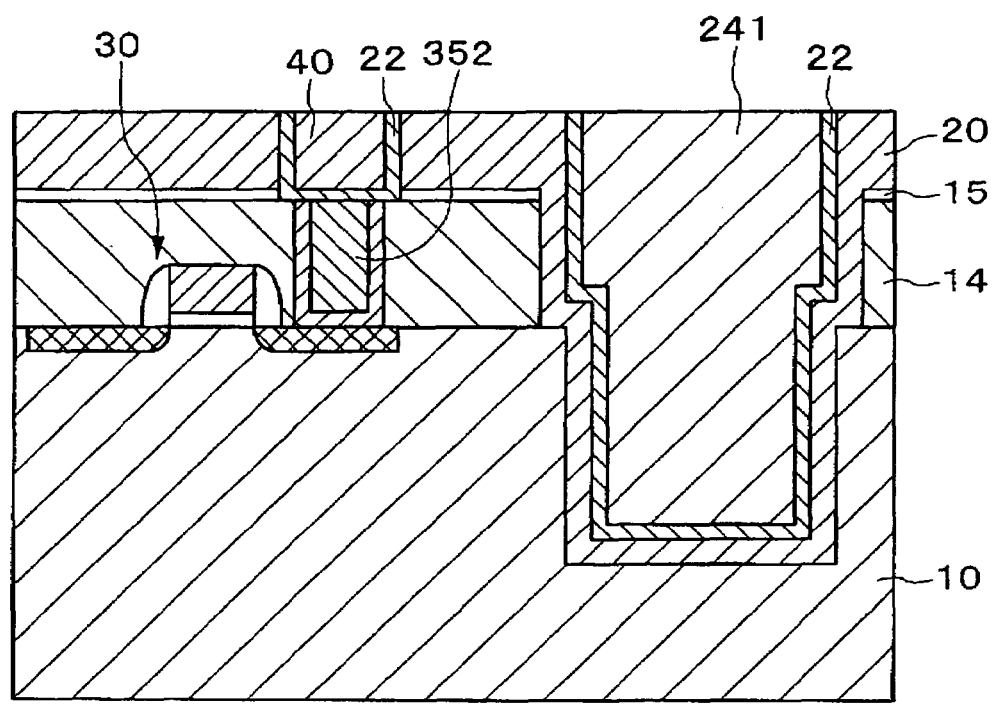
FIG. 5 is a schematic cross-sectional view showing a step of the method of manufacturing the semiconductor device after the step of FIG. 4B.

After forming the base film 22, the base film 22 is plated in the region including the inner surfaces of the holes H1 and H2 and the groove 28 by using an electrochemical plating (ECP) method. The area projecting from the insulating film 20 is polished and removed by using a chemical mechanical polishing (CMP) method or the like. This allows the holes H1 and H2 to be filled with copper which is a conductive material, and an interconnect 40 to be formed in the groove 28. Specifically, a part (first conductive layer) 241 of the connection terminal 24 and the interconnect 40 in the second layer are formed at the same time, whereby a state as shown in FIG. 5 is provided.

Formation steps of the third and subsequent layers in the circuit section are described below with reference to FIGS. 6A to 14. FIGS. 6A to 14 schematically show the configuration of the conductive layers and the connection layers which make up the connection terminal 24. In FIGS. 6A to 14, illustration of the transistor 30, the interconnect 40, the base film for forming the connection terminal 24, and the like is omitted.

Figure 6A:
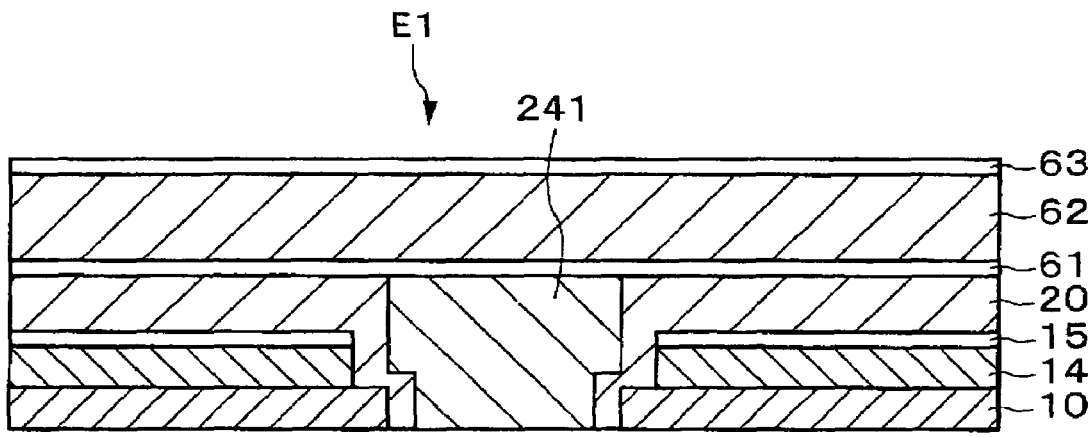
FIGS. 6A to 6C are schematic cross-sectional views each showing a step of the method of manufacturing the semiconductor device after the step of FIG. 5.

After forming the second layer in the circuit section as described above, an interlayer dielectric 62 and insulating films 61 and 63 are formed on the substrate in that order, as shown in FIG. 6A. The insulating films 61 and 63 are formed of a material differing from the material for the interlayer dielectric 62. In this embodiment, the insulating films 61 and 63 are formed of silicon nitride or silicon carbide, and the interlayer dielectric 62 is formed of silicon oxide.

Figure 6B:
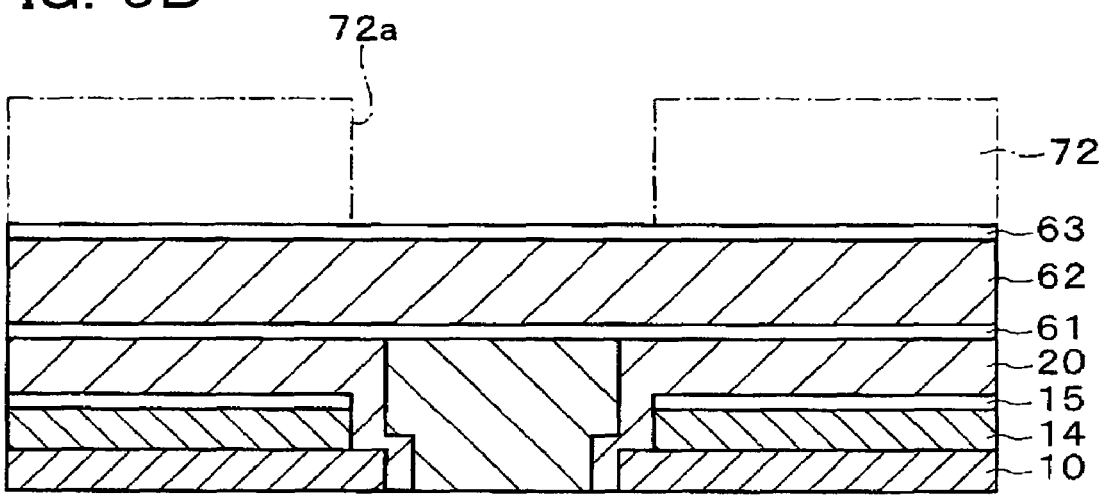

As shown in FIG. 6B, a resist 72 is applied to the insulating film 63 and patterned to form a hole 72a at a position corresponding to the connection terminal formation region E1. The hole 72a has a shape corresponding to the second conductive layer 242, and is disposed at a position at which the hole 72a superposed with the first conductive layer 241 as viewed from a direction perpendicular to the substrate. For example, the hole 72a is formed in the shape of a circle with a diameter greater than the diameter of the conductive layer 241, and is disposed concentrically with the conductive layer 241 as viewed from a direction perpendicular to the substrate.

Figure 6C:
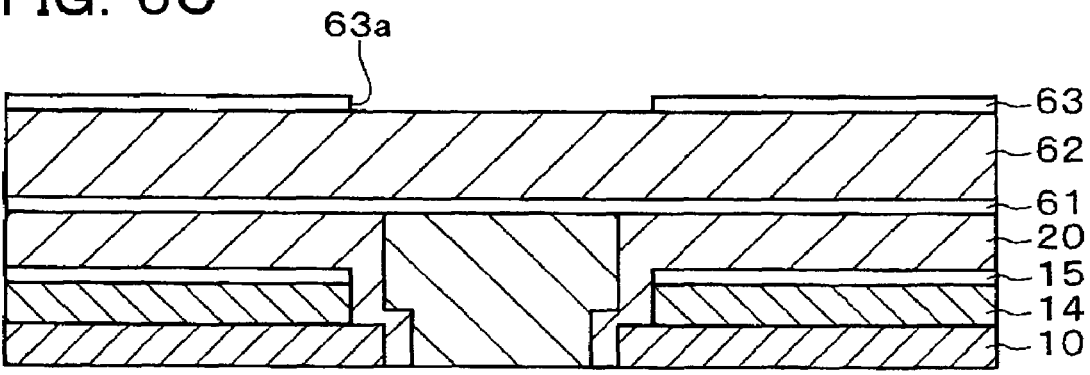

The insulating film 63 located in the hole 72a is removed by etching using the resist 72 as a mask. FIG. 6C is a cross-sectional view showing the state in which the resist 72 is removed after the etching step.

Figure 7A:
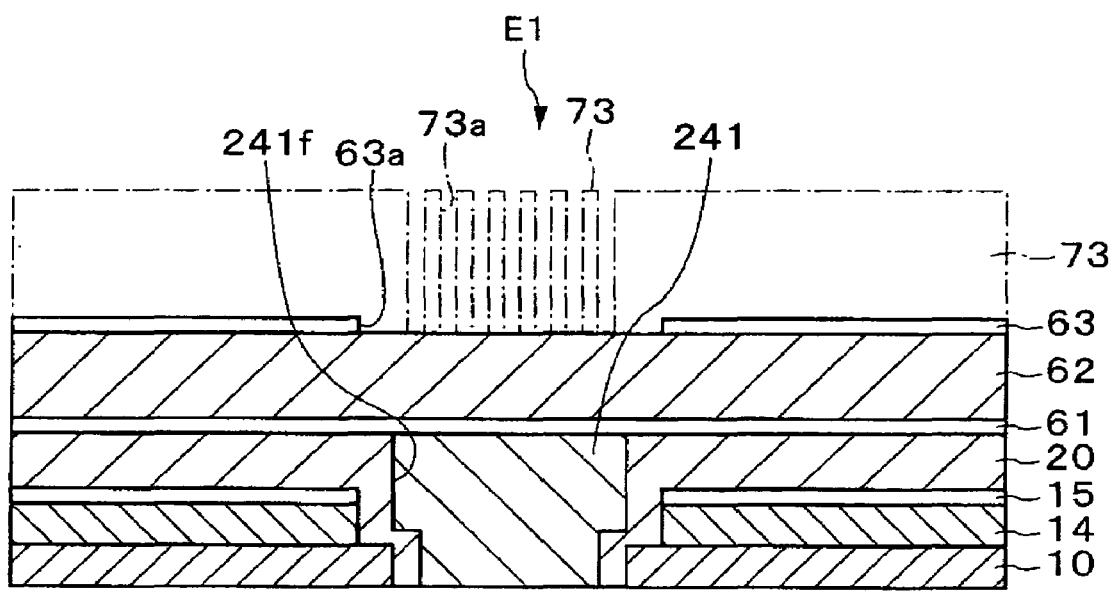
FIGS. 7A and 7B are schematic cross-sectional views each showing a step of the method of manufacturing the semiconductor device after the step of FIG. 6C.
Figure 7B:
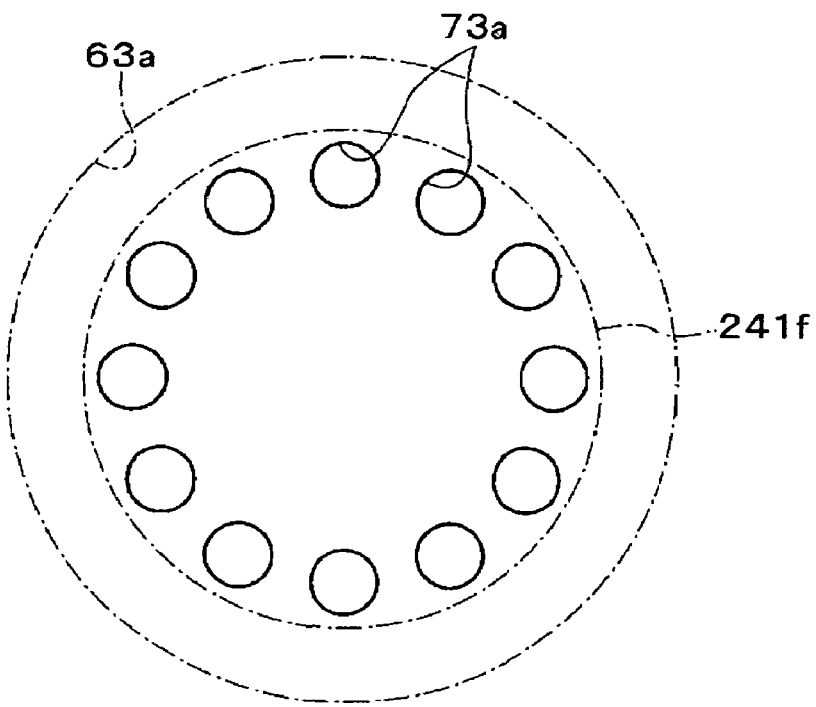

As shown in FIG. 7A, a resist 73 for forming the connection hole 241b is applied to the interlayer dielectric 62 and the insulating film 63 and patterned to form a plurality of holes 73a at positions corresponding to the connection terminal formation region E1. In this case, the holes 73a is formed to be arranged on the periphery of the conductive layer 241 as viewed from a direction perpendicular to the substrate. The holes 73a are formed circularly along the periphery of the conductive layer 241. FIG. 7B is a plan view schematically showing the arrangement of the holes 73a. In FIG. 7B, the outermost position of the first conductive layer 241 disposed in the lower layer is denoted by 241f.

In the formation step of the conductive layer 241, an excess conductive material is removed by using the CMP method. The conductive layer 241 has a diameter as large as several tens of microns. Therefore, when a component having such a large diameter is polished, the center of the conductive layer 241 is depressed to some extent after polishing due to the difference in selectivity ratio between the periphery of the conductive layer and the center of the conductive layer. If the connection hole of the first connection layer is formed at the center of the conductive layer, separation tends to occur in this area due to external stress or the like, whereby mechanical stability and electrical stability of vertical connection may be impaired. Therefore, reliability of the semiconductor device can be increased by disposing the connection holes so as to avoid the center of the conductive layer. This also applies to the formation steps of all the connection holes 241b to 244b. Therefore, in the formation steps of the connection holes 242b to 244b described later, the connection holes 242b to 244b are formed on the periphery of the conductive layer connected with the connection holes. In particular, since the depression at the center of the conductive layer becomes larger in the upper layer, a considerable effect is obtained by employing such a structure.

Figure 8A:
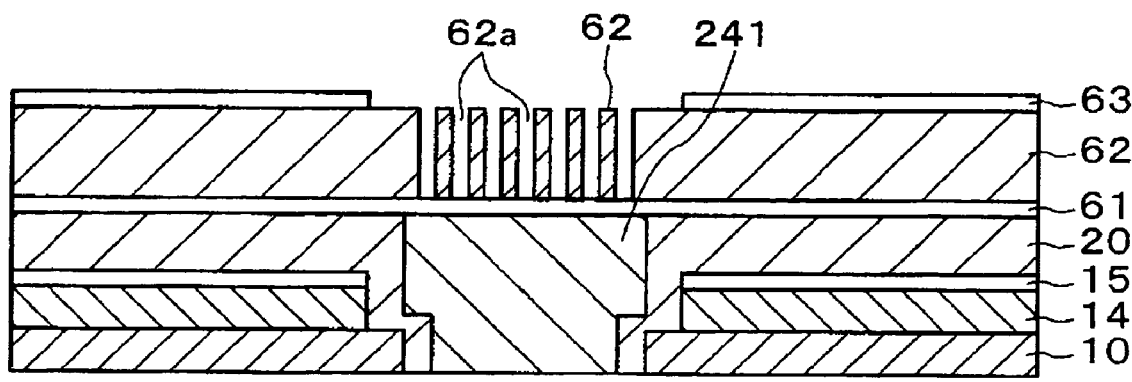
FIGS. 8A and 8B are schematic cross-sectional views each showing a step of the method of manufacturing the semiconductor device after the step of FIG. 7B.

Part of the interlayer dielectric 62 located under the holes 73a is removed by etching using the resist 73 as a mask. FIG. 8A is a cross-sectional view showing the state in which the resist 73 is removed after the etching step. A plurality of holes 62a are formed in the interlayer dielectric 62 under the holes 73a.

Figure 8B:
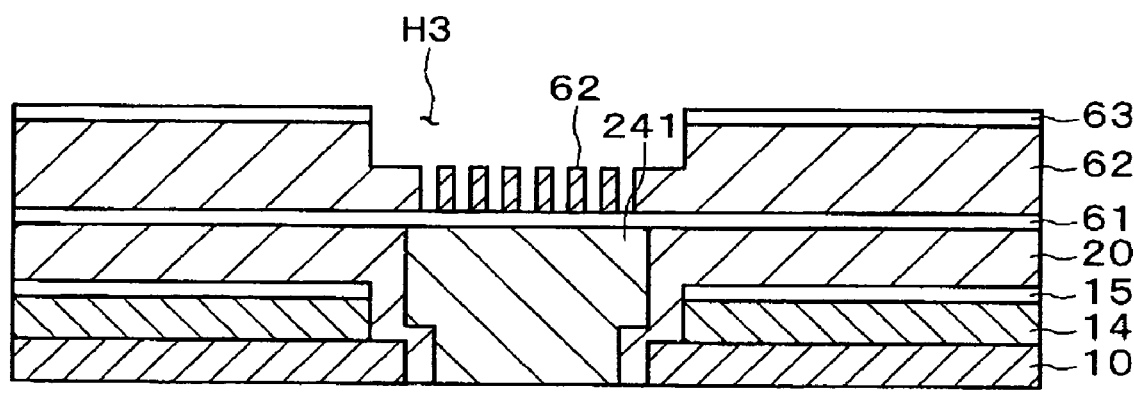

Part of the interlayer dielectric 62 is then etched back using the insulating film 63 as a mask to form a recess H3 in a region including part of the holes 62a, as shown in FIG. 8B.

Figure 9A:
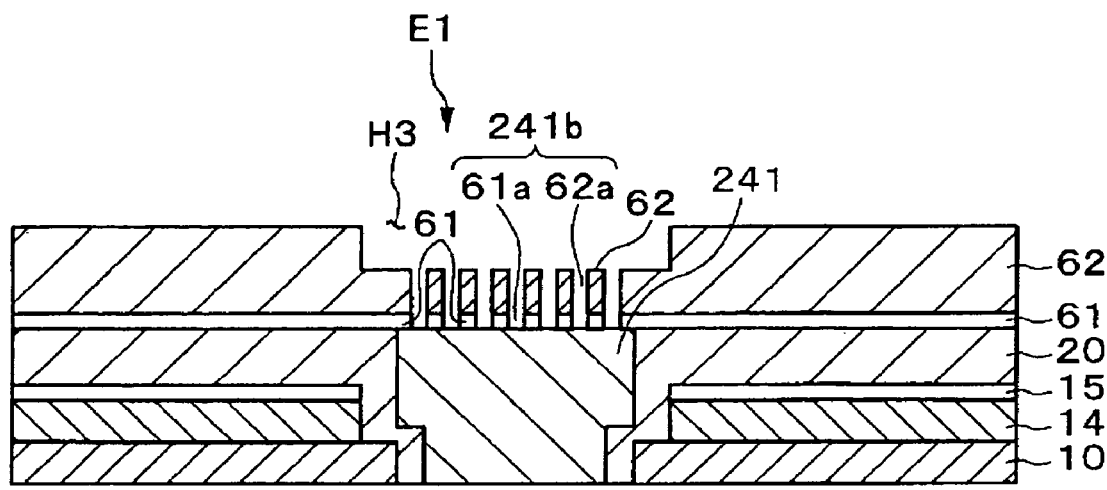
FIGS. 9A and 9B are schematic cross-sectional views each showing a step of the method of manufacturing the semiconductor device after the step of FIG. 8B.

The insulating film 63 on the interlayer dielectric 62 and part of the insulating film 61 under the holes 62a are removed by etching back. This allows holes 61a connected to the holes 62a to be formed as shown in FIG. 9A, whereby part of the surface of the first conductive layer 241 is exposed in the holes 62a. In this embodiment, the connection holes 241b are made up of the holes 61a and 62a. Specifically, the connection holes 241b are formed at a position corresponding to the connection terminal formation region E1, and the recess H3 is formed in the region including the connection holes 241b by the steps shown in FIGS. 6A to 9A.

A groove for an interconnect and a connection hole (not shown) in the second layer are formed in the interlayer dielectric 62 at a position differing from the connection terminal formation region E1 during the formation step of the connection hole 241b and the recess H3.

A base film (not shown) including a barrier layer and a seed layer is formed on the substrate using the CVD method or the like. This allows the base film to be formed on the interlayer dielectric 62 while sufficiently covering the inner surfaces of the interconnect groove, the connection holes 241b, and the recess H3.

After forming the base film, the base film is plated by using the ECP method in the region including the inner surfaces of the groove, the recess H3, and the connection holes 241b. An excess conductive material projecting from the interlayer dielectric 62 is removed by polishing using the CMP method or the like.

This allows the groove, the connection holes 241b, and the recess H3 to be filled with copper which is a conductive material, whereby an interconnect (not shown) in the third layer, the first connection layer 241a, and the second conductive layer 242 are formed.

Figure 9B:
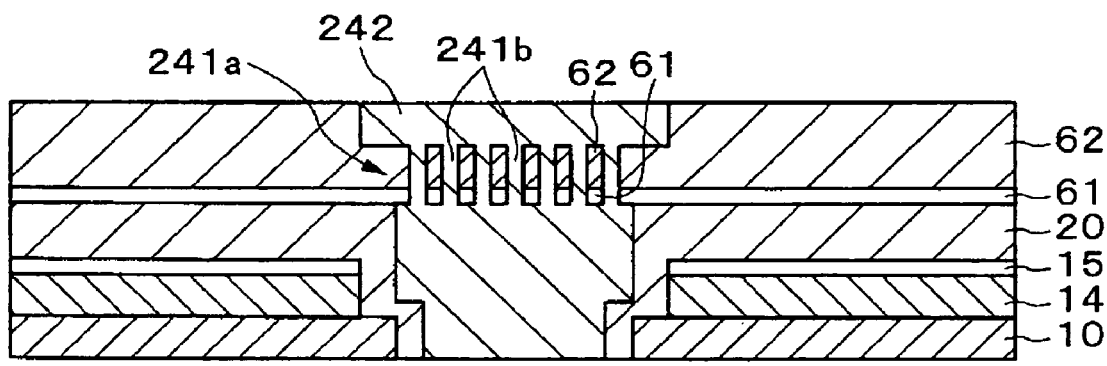

Specifically, the second conductive layer 242 conductively connected with the conductive layer 241 through the connection holes 241b is formed on the first conductive layer 241 when the interconnect in the third layer is formed, whereby a state as shown in FIG. 9B is provided.

Figure 10A:
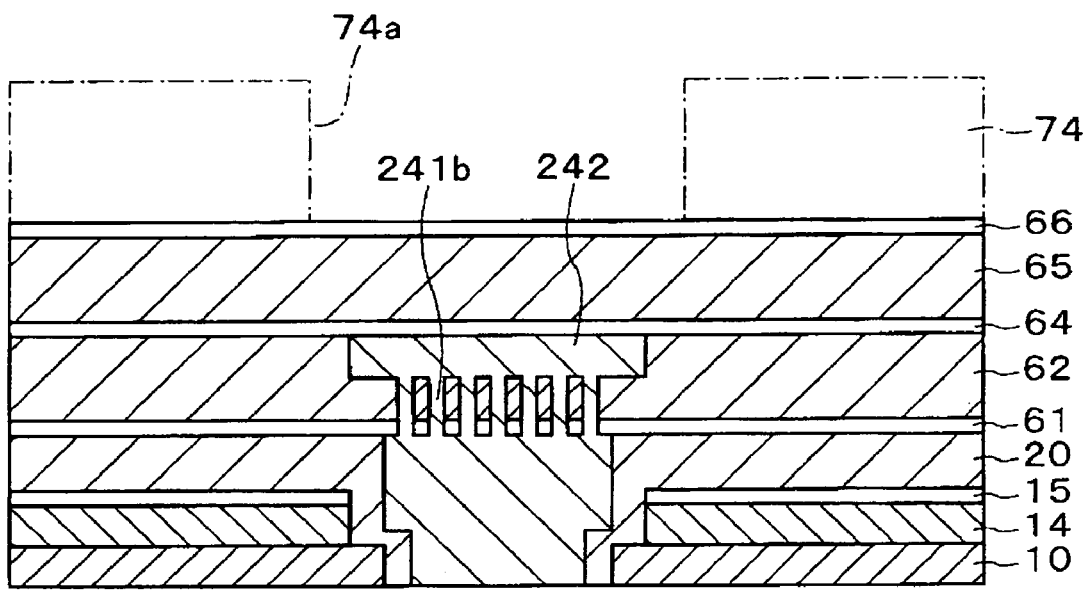
FIGS. 10A and 10B are schematic cross-sectional views each showing a step of the method of manufacturing the semiconductor device after the step of FIG. 9B.

As shown in FIG. 10A, an interlayer dielectric 65 and insulating films 64 and 66 are formed on the substrate in that order so as to form the fourth layer in the circuit section. The insulating films 64 and 66 are formed of a material differing from the material for the interlayer dielectric 65. In this embodiment, the insulating films 64 and 66 are formed of silicon nitride or silicon carbide, and the interlayer dielectric 65 is formed of silicon oxide.

A resist 74 is applied to the insulating film 66 and patterned to form a hole 74a at a position corresponding to the connection terminal formation region E1. The hole 74a has a shape corresponding to the third conductive layer 243, and is disposed at a position at which the hole 74a is superposed with the second conductive layer 242 as viewed from a direction perpendicular to the substrate. In more detail, the hole 74a is formed in the shape of a circle with a diameter greater than the diameter of the conductive layer 242, and is disposed concentrically with the conductive layer 242 as viewed from a direction perpendicular to the substrate.

Figure 10B:
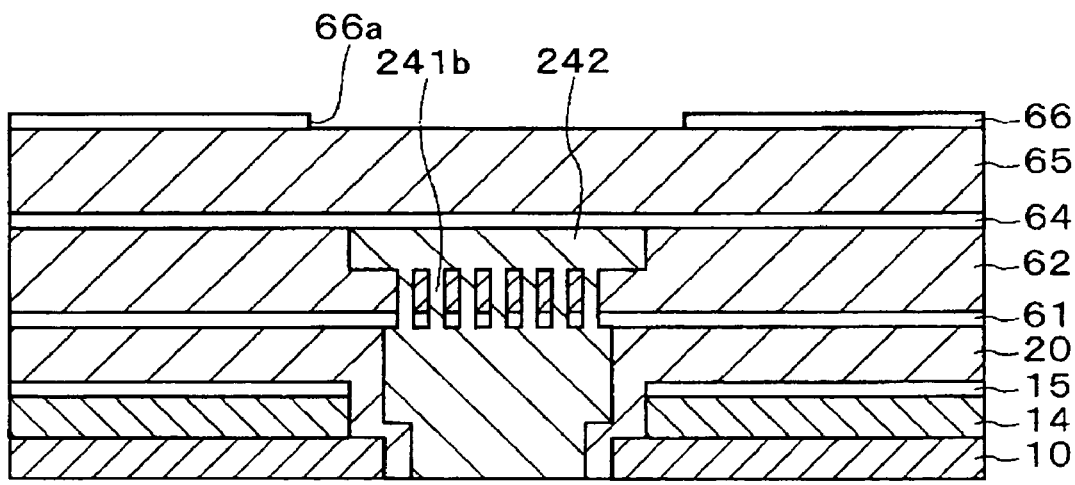

Part of the insulating film 66 located in the hole 74a is removed by etching using the resist 74 as a mask. FIG. 10B is a cross-sectional view showing the state in which the resist 74 is removed after the etching step.

Figure 11A:
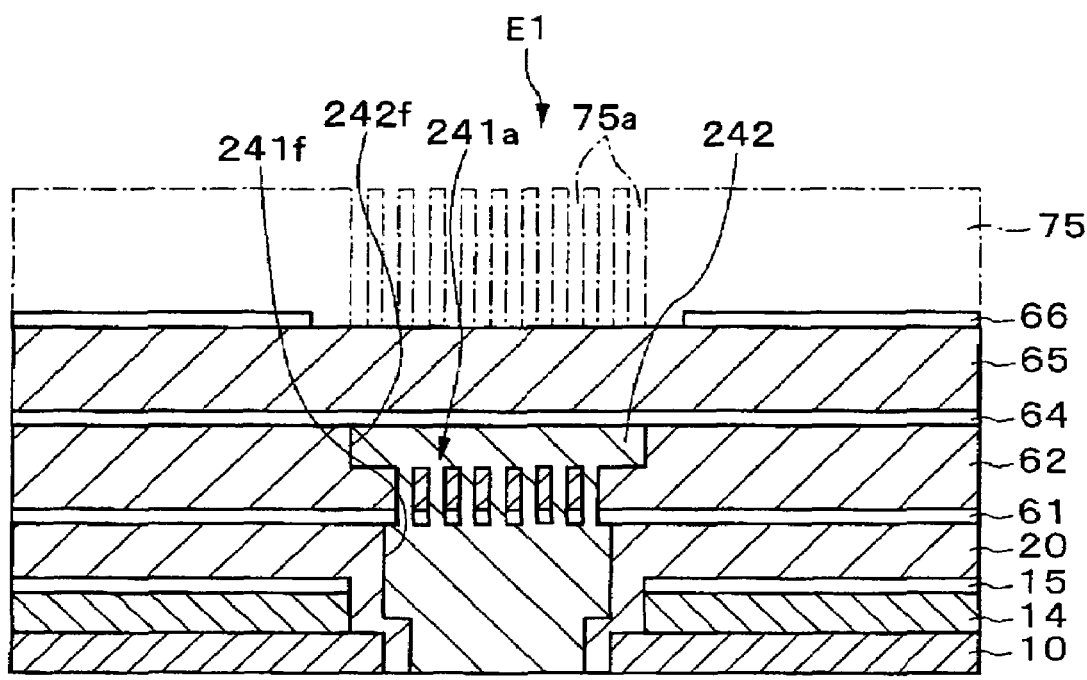
FIGS. 11A and 11B are schematic cross-sectional views each showing a step of the method of manufacturing the semiconductor device after the step of FIG. 10B.

As shown in FIG. 11A, a resist 75 for forming the connection hole 242b is applied to the interlayer dielectric 65 and the insulating film 66 and patterned to form a plurality of holes 75a at positions corresponding to the connection terminal formation region E1. The holes 75a are formed to be arranged on the periphery of the conductive layer 242 as viewed from a direction perpendicular to the substrate. The holes 75a are formed circularly along the periphery of the conductive layer 242.

Figure 11B:
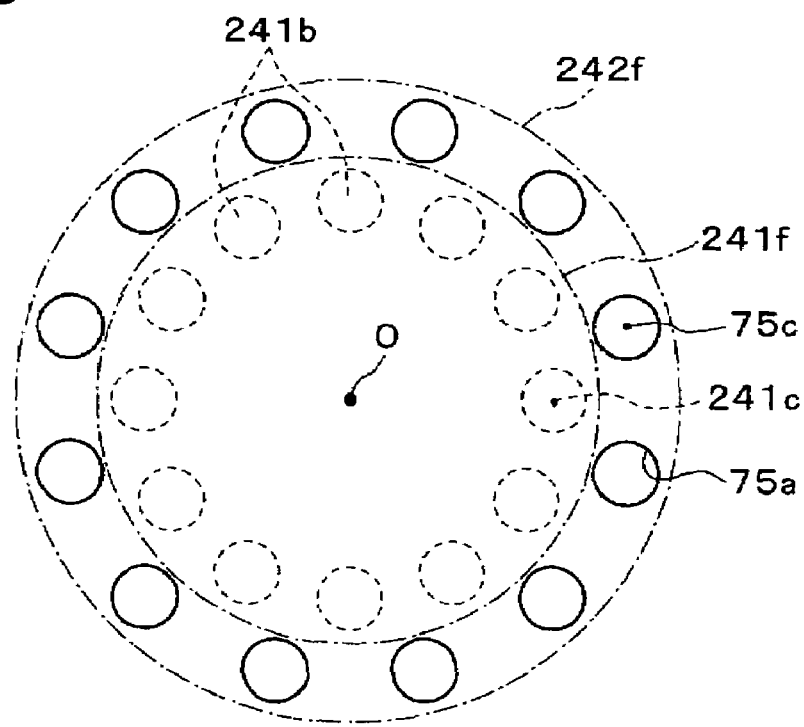

FIG. 11B is a plan view schematically showing the arrangement of the holes 75a together with the connection holes 241b disposed in the lower layer. In FIG. 11B, the outermost position of the second conductive layer 242 in the lower layer is denoted by 242f. In this embodiment, since the second conductive layer 241 is formed to have a diameter greater than the diameter of the first conductive layer, and the holes 75a are located on the periphery of the second conductive layer as viewed from a direction perpendicular to the substrate, the positions of the holes 75a (positions of the connection holes 242b in the second connection layer 242a) do not coincide with the positions of the connection holes 241b in the first connection layer 241a. In this embodiment, a position O on the center axis of the first conductive layer 241 and the second conductive layer 242 is not disposed at the same point as a position 75c on the center axis of the holes 75a and a position 241c on the center axis of the connection hole 241b (or disposed in a staggered arrangement).

Figure 12A:
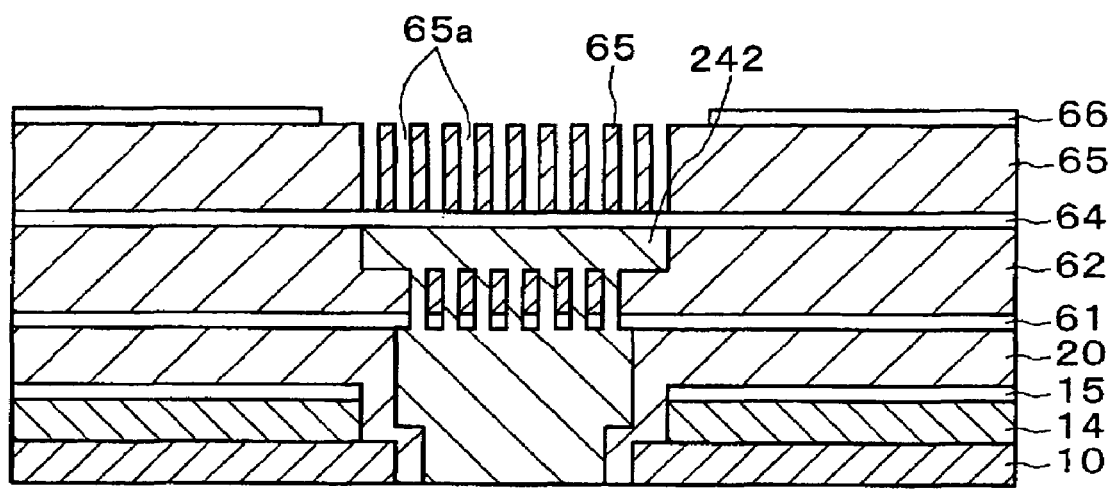
FIGS. 12A and 12B are schematic cross-sectional views each showing a step of the method of manufacturing the semiconductor device after the step of FIG. 11B.

Part of the interlayer dielectric 65 located under the holes 75a is removed by etching using the resist 75 as a mask. FIG. 12A is a cross-sectional view showing the state in which the resist 75 is removed after the etching step. A plurality of holes 65a are thus formed in the interlayer dielectric 65 at positions under the holes 75a.

Figure 12B:
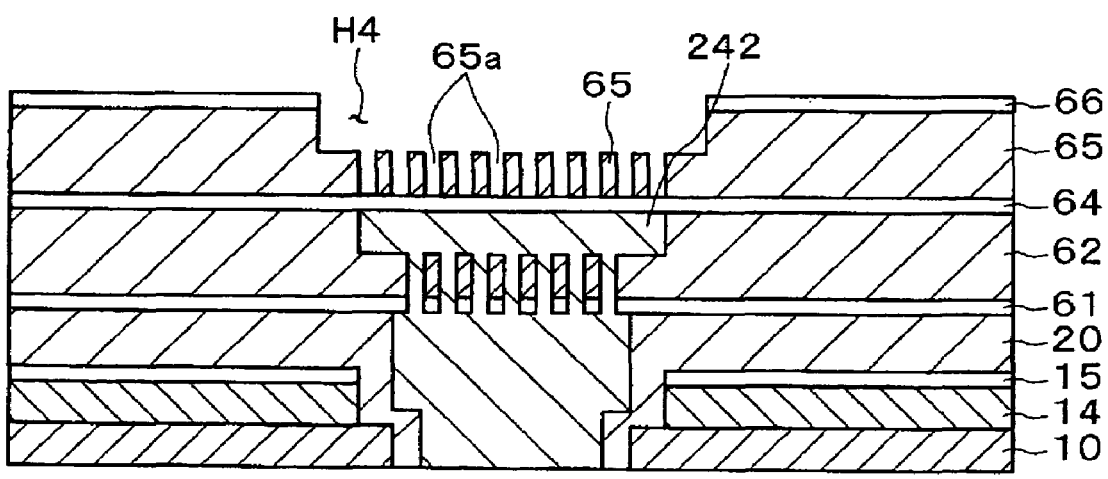

Part of the interlayer dielectric 65 is then etched back using the insulating film 66 as a mask to form a recess H4 in a region including part of the holes 65a, as shown in FIG. 12B.

Figure 13A:
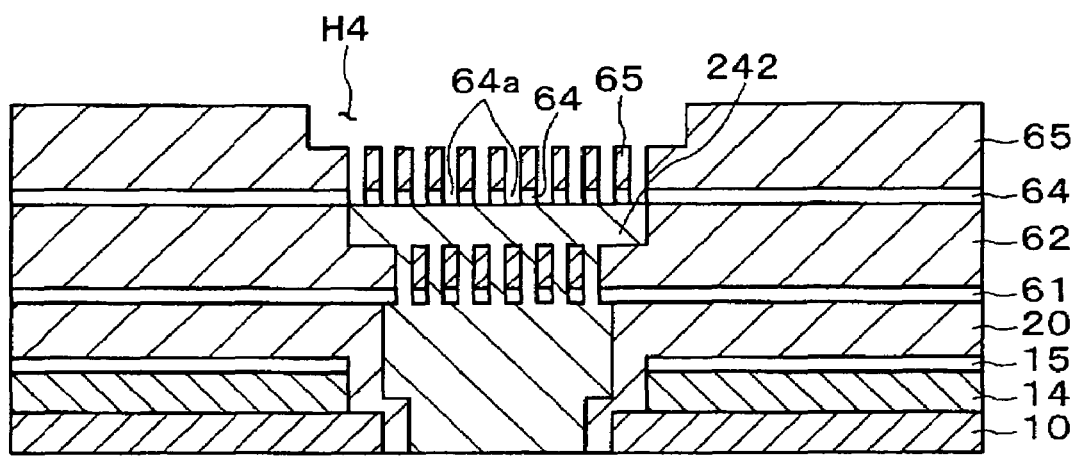
FIGS. 13A and 13B are schematic cross-sectional views each showing a step of the method of manufacturing the semiconductor device after the step of FIG. 12B.

The insulating film 66 on the interlayer dielectric 65 and part of the insulating film 64 under the holes 65a are removed by etching back. This allows holes 64a connected to the openings 65a to be formed as shown in FIG. 13A, whereby part of the surface of the second conductive layer 242 is exposed to the openings 65a. The holes 64a and 65a form the connection holes 242b. Consequently, the steps shown in FIGS. 10A to 13A provide the connection holes 242b at the position corresponding to the connection terminal formation region E1, and the recess H4 is formed in a region including the connection holes 242b.

A groove for an interconnect in the second layer and a connection hole (not shown) are formed in the interlayer dielectric 62 at a position differing from the connection terminal formation region E1 during the formation step of the connection hole 241b and the recess H3.

A base film (not shown) including a barrier layer and a seed layer is formed on the substrate by the CVD method or the like. This allows the base film to be formed on the interlayer dielectric 65 while sufficiently covering the inner surfaces of the interconnect groove, the connection holes 242b, and the recess H4.

After forming the base film, the base film is plated by using the ECP method in the region including the inner surfaces of the groove, the recess H4, and the connection holes 242b. An excess conductive material projecting from the interlayer dielectric 65 is removed by polishing by the CMP method or the like.

Figure 13B:
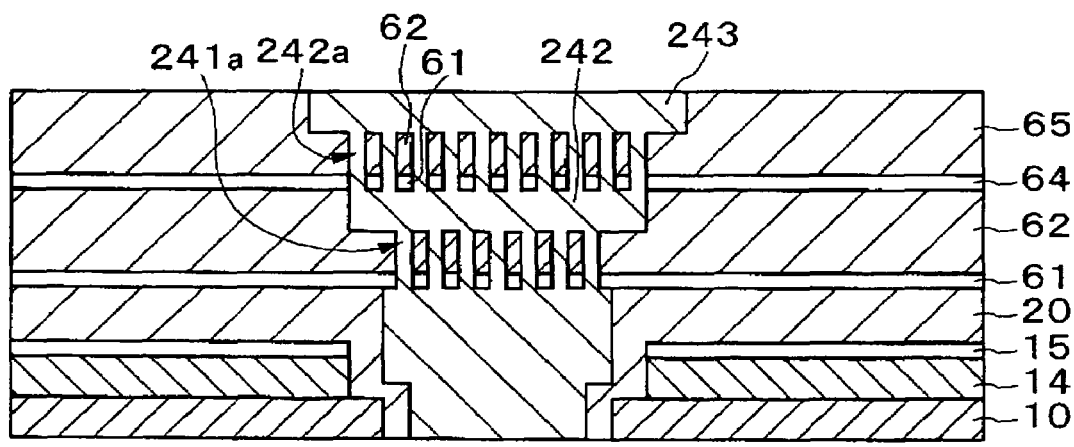

This allows the groove, the connection holes 242b, and the recess H4 to be filled with copper which is a conductive material, whereby an interconnect (not shown) in the fourth layer, the second connection layer 242a, and the third conductive layer 243 are formed. Specifically, the third conductive layer 243 conductively connected with the conductive layer 242 through the connection holes 242b is formed on the second conductive layer 242 when the interconnect in the fourth layer is formed, whereby a state as shown in FIG. 13B is provided.

Figure 14:
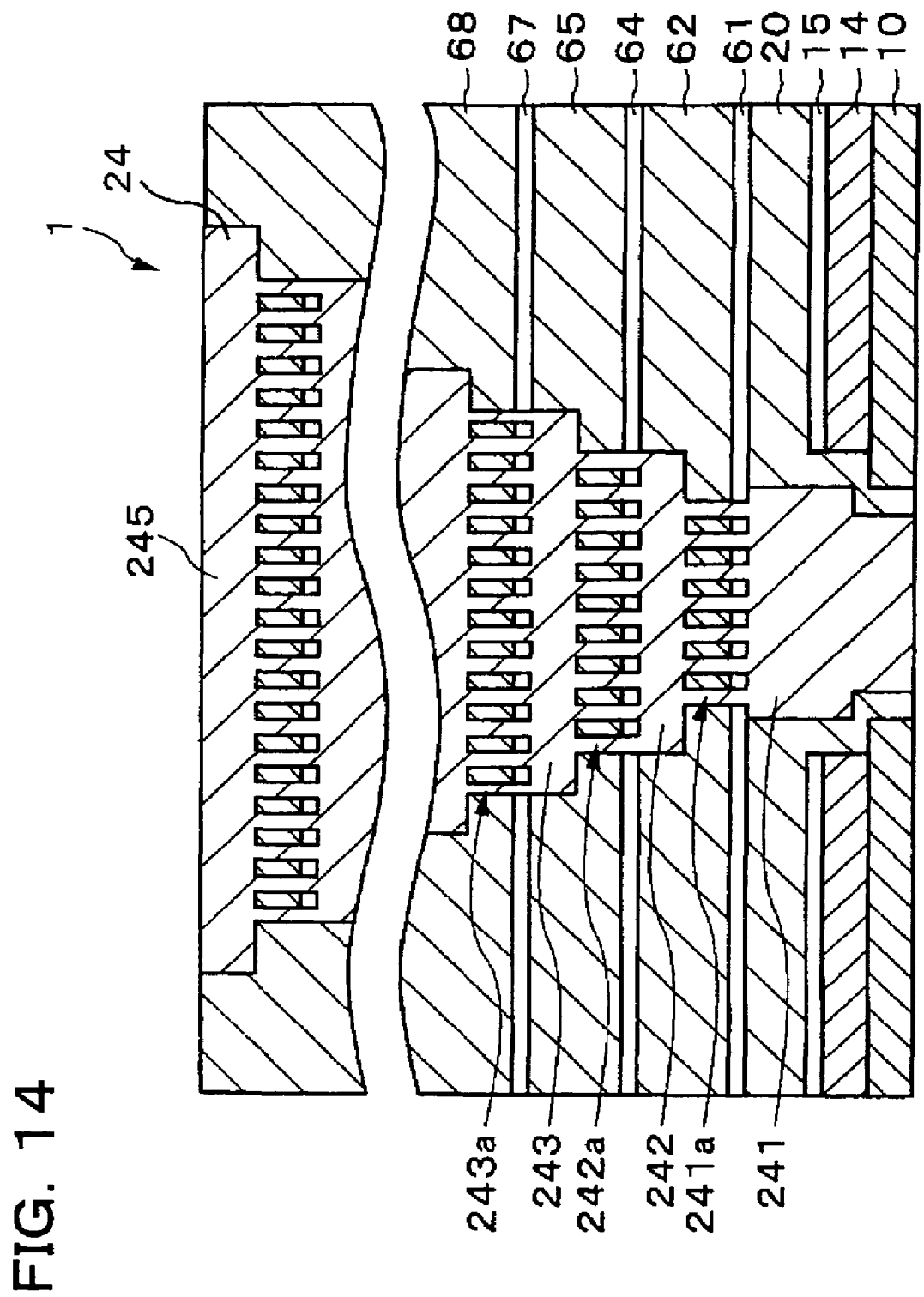
FIGS. 14 is a schematic cross-sectional view showing a step of the method of manufacturing the semiconductor device after the step of FIG. 13B.

The fourth and subsequent layers are formed in the same manner as described above. The connection terminal 24 is formed in such a manner that one layer is added when forming the interconnect in each layer. FIG. 14 is a cross-sectional view showing a state in which the electrode pad 245, which is the final conductive layer, is formed. In the third and subsequent layers, the interconnect may be formed by forming a connection hole filled with a conventional tungsten plug and forming an aluminum interconnect.

The semiconductor chip 1 manufactured by the above-described steps is ground on the back surface of the substrate 10 until the connection terminal 24 is exposed from the back surface of the substrate 10, for example. The connection terminal 24 may be exposed from the back surface of the substrate 10 by grinding the back surface of the substrate 10 close to the connection terminal 24, and etching the back surface of the substrate 10 so that the connection terminal 24 is exposed.

A three-dimensional mounting type (stacked) semiconductor device which enables high-density mounting can be manufactured by stacking and interconnecting the semiconductor chips 1 thus obtained through the connection terminals 24.

The semiconductor chips may be stacked by bonding the electrodes of the adjacent semiconductor chips disposed on the upper and lower sides while securing electrical connection between the electrodes using a filler metal 19 (see FIG. 1) such as solder. An adhesive may be used merely for bonding the semiconductor devices. The adhesive may be a liquid or gelled adhesive or an adhesive sheet. The adhesive may contain an epoxy resin as a main material, or be an insulating adhesive.

In the case where the semiconductor chips are bonded and electrically connected using an adhesive, an adhesive containing a conductive substance may be used. The conductive substance includes particles of a solder or the like dispersed in an adhesive material. The particles function as a solder when bonding the connection targets, whereby bondability can be further improved. The adhesive may be an anisotropic conductive adhesive (ACA) in which conductive particles are dispersed, such as an anisotropic conductive film (ACF) or anisotropic conductive paste (ACP). The anisotropic conductive adhesive is an adhesive in which conductive particles (fillers) are dispersed in a binder. A dispersing agent may be added to the anisotropic conductive adhesive.

A heat-curable adhesive is generally used as the binder for the anisotropic conductive adhesive. In this case, conductive particles are present between the interconnect pattern and the electrode to achieve electrical connection between the interconnect pattern and the electrode.

The electrodes may be electrically connected to each other by applying a metal junction such as Au—Au, Au—Sn, or solder junction. For example, the material is provided to the electrode, and the electrodes are bonded by applying heat, ultrasonic vibration, or ultrasonic vibration and heat. After the electrodes are bonded, the material provided to the electrode is diffused due to vibration or heat, whereby a metal junction is formed.

An external terminal is connected with the connection terminal 24 of the semiconductor device located at the bottom (or top) of the three-dimensional mounting type semiconductor device formed by stacking the semiconductor devices. The external terminal may be formed of a solder, a metal or the like. However, the material for the external terminal is not limited thereto. It suffices that the external terminal be formed of a conductive material. A solder ball is not necessarily provided. A semiconductor module may be formed by mounting the semiconductor device on a substrate. An electrical connection may be achieved by utilizing surface tension during melting of solder cream applied to a motherboard when mounting the semiconductor device on the motherboard without forming a solder ball.

According to this embodiment, since the connection terminal 24 is formed when forming the circuit section, the steps can be simplified in comparison with a conventional method in which the formation steps of the circuit section and the formation steps of the conductive material are separately performed, whereby the manufacturing cost can be reduced. Specifically, since the above-described method can reduce the formation time of the connection terminal at least in the area disposed in the interlayer dielectric in the circuit section in comparison with a conventional method, the above-described method has an advantage in that the process time can be reduced as the number of layers in the circuit section is increased (as the thickness of the interlayer dielectric formed on the substrate is increased).

Moreover, since the conductive layers which make up the connection terminal 24 are electrically connected through a plurality of connection holes, mechanical and electrical stability of vertical connection can be increased.

Furthermore, since the connection holes formed in one connection layer are disposed at a position differing from the connection holes formed in the adjacent connection layer on a plane, mechanical strength can be further improved. In particular, since the connection holes in the adjacent connection layers are disposed in a staggered arrangement as viewed from a direction perpendicular to the substrate, a structure with extremely excellent mechanical strength can be formed. In more detail, the diameters of the conductive layers formed in layers are increased in the order from the lower layer, and the connection holes formed in the single connection layer are disposed along the periphery of the conductive layer connected therewith in the lower layer. In this case, the connection holes formed in one connection layer are inevitably disposed at a position differing from the connection holes formed in the adjacent connection layer on a plane. Therefore, the degrees of freedom relating to design, such as the size and interval of the connection holes, can be increased while maintaining mechanical strength of the device. In addition, separation due to external stress or the like rarely occurs by forming the connection holes belonging to one connection layer along the periphery of the conductive layer connected therewith.

In the present embodiment, the conductive layers 241 to 244 and the connection layers 241a to 244a are disposed directly under the electrode pad 245 (specifically, the connection terminal is disposed inside the electrode pad as viewed from a direction perpendicular to the substrate). Therefore, substrate space can be saved in comparison with a configuration in which the connection terminal 24 is formed at a position differing from the formation position of the electrode pad and the connection terminal 24 is connected with the electrode pad using a wiring pattern, whereby an increase in function and a reduction of size of the semiconductor chip can be implemented.

A method of manufacturing a semiconductor device according to a second embodiment of the present invention is described below. FIGS. 15A to 19 are cross-sectional views showing steps relating to the present invention among a series of steps for manufacturing the semiconductor device 100. Note that the components in this embodiment having substantially the same function as the components in the first embodiment are denoted by the same reference numbers and further description thereof is omitted.

In this manufacturing method, when forming the connection terminal 24 and the interconnect in each layer, a connection plug for electrically connecting the interconnect with the lower layer is further formed at the same time.

Figure 15A:
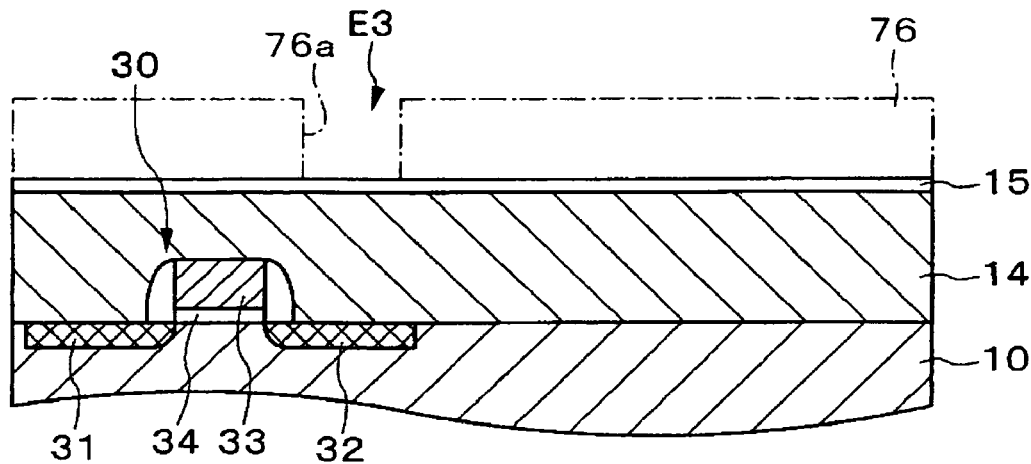
FIGS. 15A to 15C are schematic cross-sectional views each showing a step of a method of manufacturing a semiconductor device according to a second embodiment of the present invention.

In this embodiment, the first layer including a circuit device such as the transistor 30 is formed on the substrate 10 using a conventional method, as shown in FIG. 15A.

The insulating film 14 is formed of borophosphosilicate glass (BPSG) on the first layer. The insulating film 15 having an etching rate differing from those of the insulating film 14 and the hard mask 29 formed in a step described later and having diffusion barrier properties for the material for the connection terminal 24 formed in a step described later is formed of silicon nitride, silicon carbide, or the like on the surface of the insulating film 14.

A resist 76 is applied to the substrate and patterned to form a hole 76a at an interconnection hole formation region E3 (in which an interconnection hole 35 will be formed).

Figure 15B:
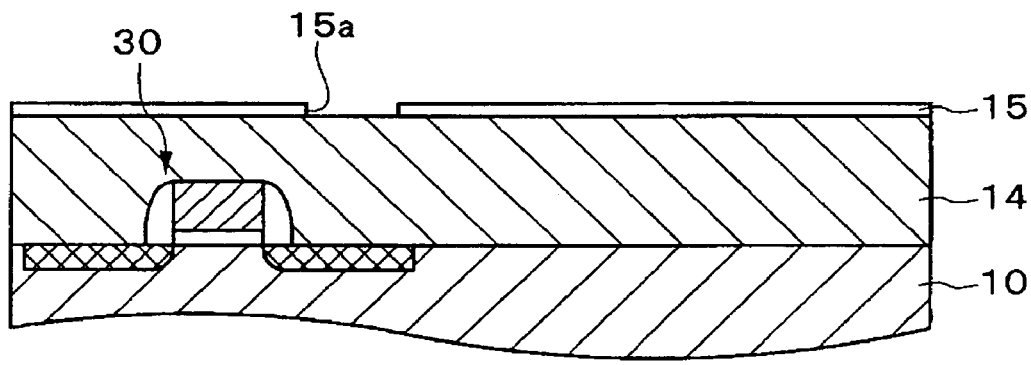

The insulating film 15 located in the hole 76a is removed by etching using the resist as a mask. FIG. 15B is a cross-sectional view showing the state in which the resist 76 is removed after the etching step. A hole 15a is formed in the insulating film 15 at a position under the opening 76a (a position corresponding to the interconnection hole formation region E3).

Figure 15C:
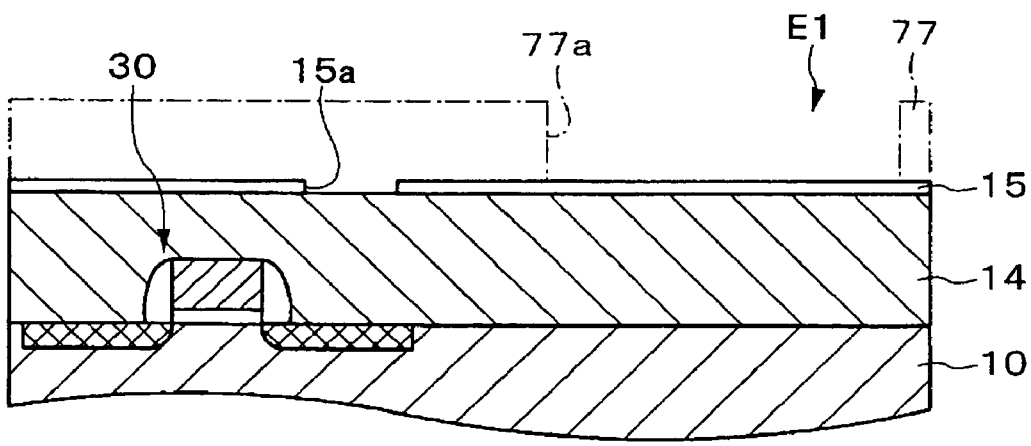

As shown in FIG. 15C, a resist 77 is applied to the substrate and patterned to form a hole 77a in the connection terminal formation region E1. The shape of the hole 77a in the resist 77 is determined depending on the shape of the hole H1. For example, the resist 77 has a circular opening with a diameter of 60 μm.

Figure 16A:
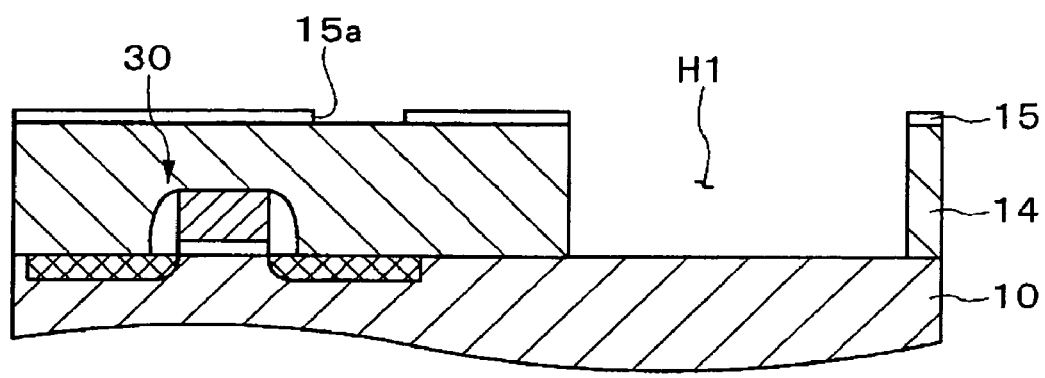
FIGS. 16A and 16B are schematic cross-sectional views each showing a step of the method of manufacturing a semiconductor device after the step of FIG. 15C.

Part of the insulating films 14 and 15 located under the hole 77a are removed by etching using the resist 77 as a mask. FIG. 16A is a cross-sectional view showing the state in which the resist 77 is removed after the etching. A hole H1 is thus formed in the insulating films 14 and 15 at a position under the hole 77a (or a position corresponding to the connection terminal formation region E1).

Figure 16B:
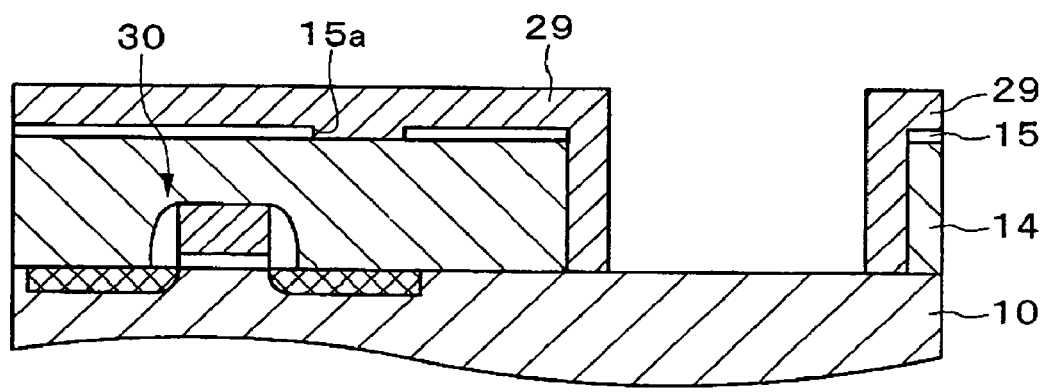

As shown in FIG. 16B, the etching hard mask 29 for forming a hole in the substrate 10 is formed. The hard mask 29 is formed to cover the upper surface of the insulating film 15 and the inner surface of the hole H1. After forming the hard mask 29 on the entire surface, part of the hard mask 29 on the bottom of the hole H1 is removed to expose the surface of the substrate 10 to the hole H1.

Figure 17A:
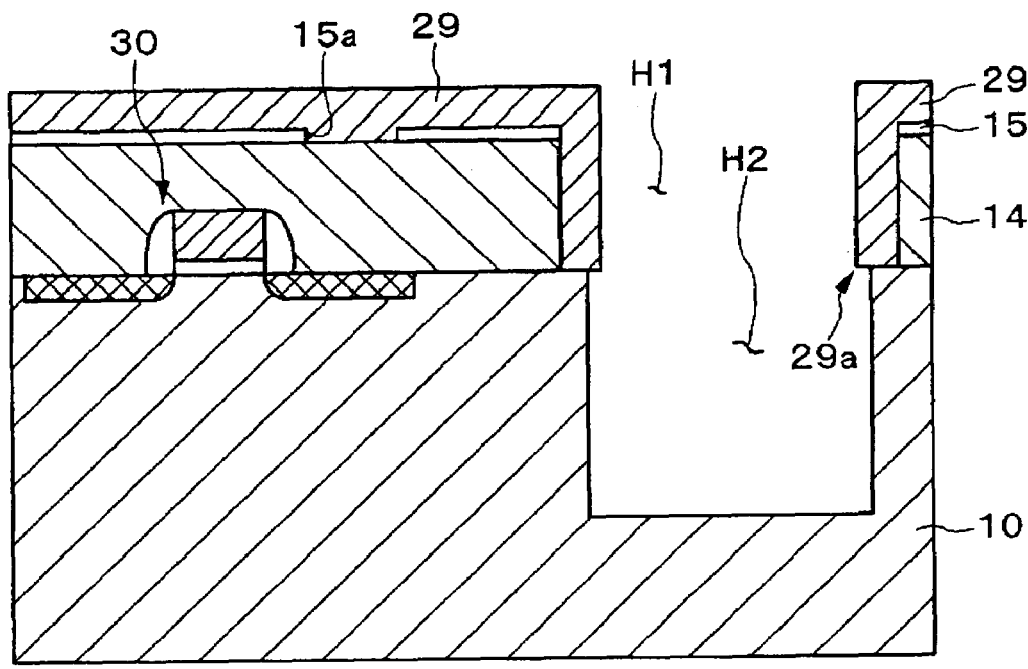
FIGS. 17A and 17B are schematic cross-sectional views each showing a step of the method of manufacturing a semiconductor device after the step of FIG. 16B.
Figure 17B:
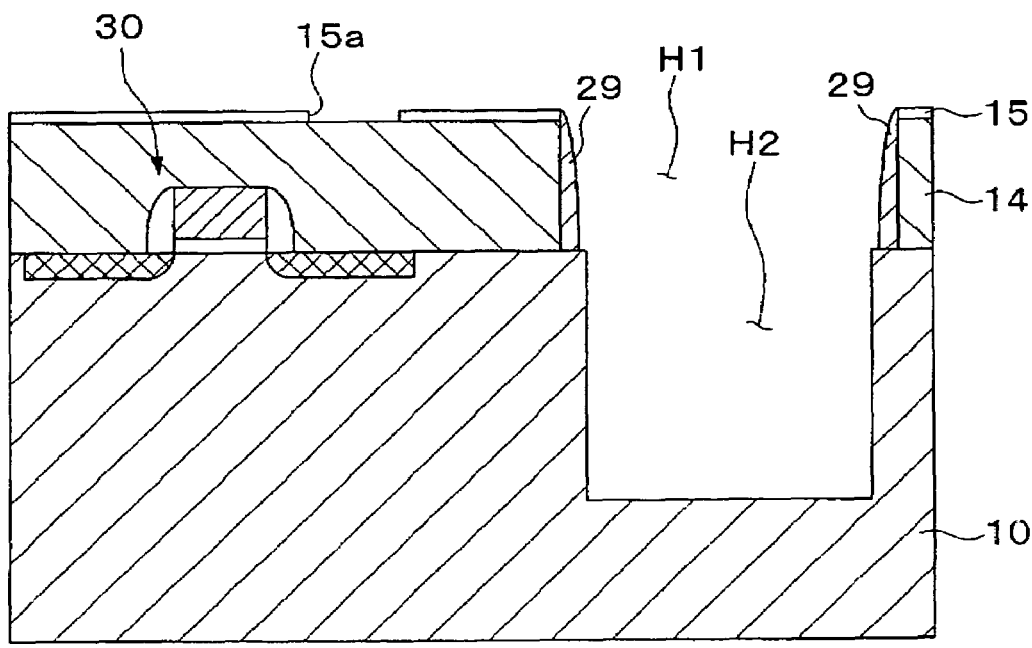

As shown in FIG. 17A, a hole is formed in the substrate 10 by dry etching using the hard mask 29 having the opening. After the above-described steps are completed, the remaining hard mask 29 projects inward from the inner surface of the hole H2, thereby posing inconvenience in the subsequent process. Therefore, the hard mask 29 and the projecting section 29a are removed by etching the entire remaining hard mask 29. It is preferable to use etching having a high selectivity ratio, that is, having a high etching rate for the hard mask 29 and the insulating film 14 and a low etching rate for the insulating film 15 so that etching stops at the insulating film 15, as shown in FIG. 17B. It is preferable to use anisotropic etching such as dry etching so that the thin film hard mask 29 remains on the inner walls of the insulating film 14 and the insulating film 15, as shown in FIG. 17B.

Figure 18A:
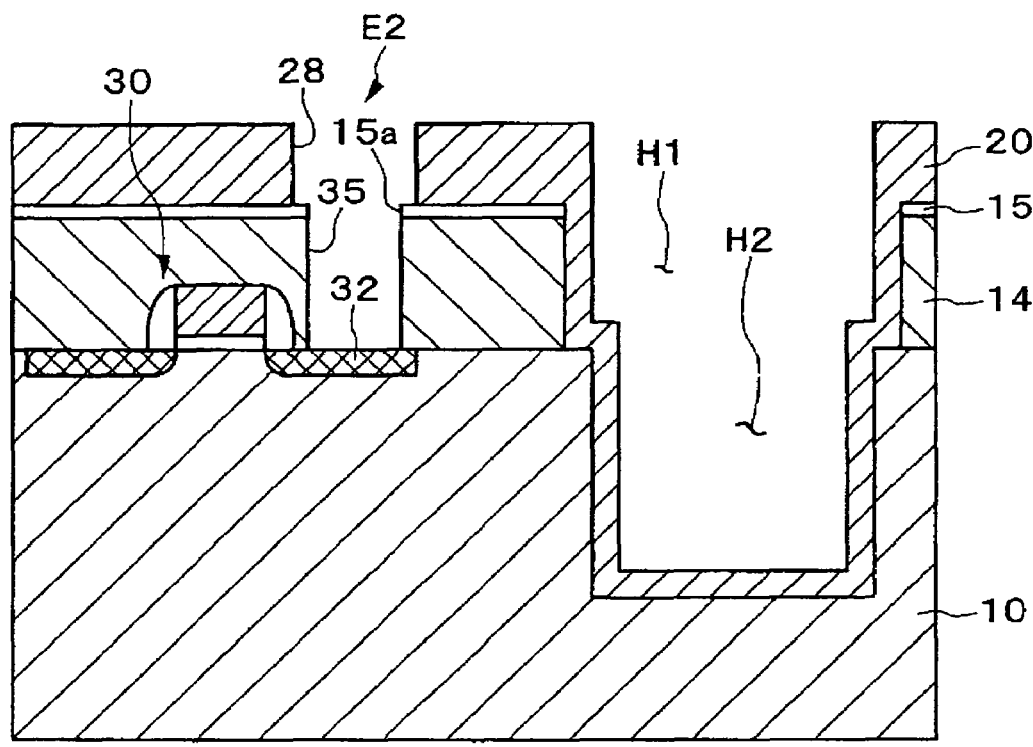
FIGS. 18A and 18B are schematic cross-sectional views each showing a step of the method of manufacturing a semiconductor device after the step of FIG. 17B.

The hole H2 is covered with an insulating film to form the insulating film 20 on the inner surfaces of the holes (H1 and H2) formed through the substrate 10 and the insulating films 14 and 15, as shown in FIG. 18A. The insulating film 20 may be a silicon nitride film formed to a thickness of about 1 to 3 μm using the plasma CVD method. The insulating film 20 may be formed by forming (stacking) the silicon oxide film and the silicon nitride film to have a thickness of about 1 to 3 μm in total. In the case of forming the insulating film 20 by stacking the silicon oxide film and the silicon nitride film, the silicon oxide film may be formed at a position closer to the substrate 10 than the silicon nitride film by forming the silicon nitride film after forming the silicon oxide film.

A resist (not shown) is applied to the insulating film 20. The resist is used to form the groove 28 for an interconnect in the second circuit layer in the insulating layer 20 and to form the interconnection hole 35 which is connected to the drain section 32 of the transistor in the first circuit layer directly under the groove 28. After applying the resist, an opening (not shown) is formed by patterning at a position corresponding to the groove formation region E2. Part of the insulating film 20 located under the opening is removed by etching using the resist as a mask, whereby the surface of the insulating film 15 is exposed to the opening. The interconnect groove 28 is thus formed located above the drain section 32 of the transistor 30. The insulating film 14 is removed by etching through the hole 15a in the insulating film 15, whereby the drain section 32 of the transistor 30 is exposed in the opening. The insulating film 15 formed of silicon nitride or silicon carbide functions as an etch stopper, whereby the interconnection hole 35 having a shape determined depending on the shape of the opening in the insulating film 15 is formed in the insulating film 14. FIG. 18A is a cross-sectional view showing the state in which the resist for forming the groove and the connection hole is removed after etching.

Figure 18B:
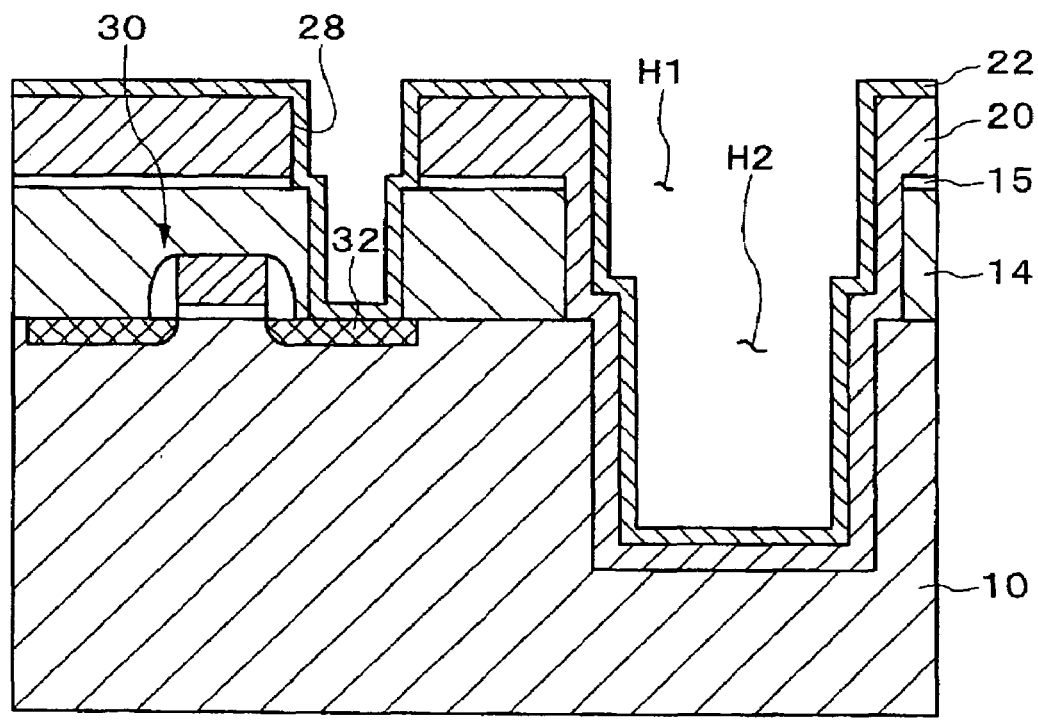

As shown in FIG. 18B, the base film 22 including a barrier layer and a seed layer is formed on the substrate using the CVD method, sputtering method, or the like. This allows the base film 22 to be formed on the insulating film 20 while sufficiently covering the inner surfaces of the groove 28, the interconnection hole 35, and the holes H1 and H2.

Figure 19:
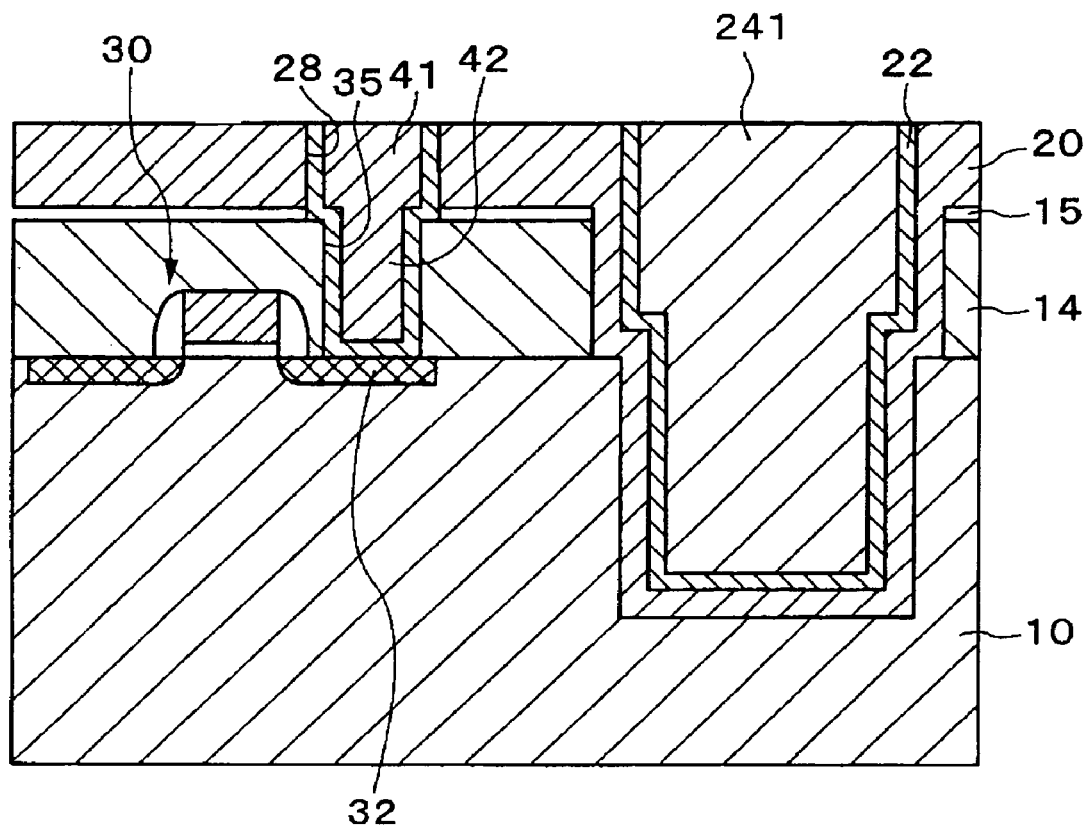
FIG. 19 is a schematic cross-sectional view showing a step of the method of manufacturing a semiconductor device after the step of FIG. 18B.

After forming the base film 22, the base film 22 is plated in the region including the inner surfaces of the holes H1 and H2 and the groove 28 by using the electrochemical plating (ECP) method. Unnecessary copper and barrier layer projecting from the insulating film 20 are removed by using the CMP method or the like, whereby a state as shown in FIG. 19 is provided. The holes H1 and H2 are filled with copper which is a conductive material, and the interconnect 41 is formed in the groove 28. Moreover, a connection plug 42 which electrically connects the first layer with the second layer is formed in the interconnection hole 35 directly under the interconnect.

The third and subsequent circuit layers are formed in the same manner as described above. The connection terminal is formed in such a manner that a layer is added each time when the interconnect and the connection hole are formed.

The subsequent steps are the same as the steps in the first embodiment. Therefore, description of these steps is omitted.

In this embodiment, since the connection terminal 24 is formed when forming the circuit section, a chip can be efficiently manufactured in comparison with a conventional method. Moreover, since the connection plug 42 which connects the layers is also formed when forming the connection terminal 24 in addition to the interconnect in each layer, manufacturing efficiency can be further increased in comparison with the method in the first embodiment in which the plug formation step is separately performed.

The present invention is not limited to the above-described embodiment. Various modifications and variations are possible within the spirit and scope of the present invention.

In the first embodiment, the recess H3 is formed after forming the holes 62a. However, these steps may be performed in an arbitrary order. The formation step of the recess H4 and the formation step of the holes 65a may be performed in an arbitrary order. In the above embodiments, the connection hole 241b (or connection hole 242b) is formed by forming an opening in a part of the interlayer dielectric 62 (or insulating film 64) by etching back after the formation step of the recess H3 (or the recess H4). However, the formation step of the recess and the formation step of the connection hole may be performed in an arbitrary order. For example, the connection hole 241b or the connection hole 242b may be formed by forming an opening in the interlayer dielectric 62 or the insulating film 64 by etching back before forming the recess H3 or H4. The hole formation step of the present invention is performed by the formation step of the recess and the formation step of the connection hole.

In the above embodiments, the substrate hole is formed after forming the device in the first layer in the circuit section. However, the formation step of the substrate hole H2 may be performed after forming the second layer. This type of semiconductor device generally includes a plurality of circuit blocks. The semiconductor device includes a "local interconnect" for achieving electrical connection in a very small range near the device, a "semi global interconnect" for transferring a signal in a single circuit block, and a "global interconnect" for interconnecting the circuit blocks as the interconnects in the circuit section. These interconnects are stacked on the substrate in the order of the local interconnect, the semi global interconnect, and the global interconnect. The interconnect width is increased in that order.

If the thinnest local interconnect and the connection terminal with a diameter as great as 50 μm or more are formed at the same time, the conductive material is formed on the interconnect to a considerable thickness while filling the holes H1 and H2 with the conductive material. Therefore, a long period of time is required for polishing the conductive material using the CMP method or the like. Therefore, it is preferable to form the connection terminal after the formation step of the local interconnect. Specifically, the connection terminal 24 can be formed more efficiently by performing the formation step of the holes H1 and H2 after the formation step of the local interconnect, and filling the holes H1 and H2 with the conductive material when forming the semi global interconnect or the global interconnect.

Although the above embodiments described the connection terminal formed directly under the electrode pad 245 as an example, the pad and the connection terminal may be formed at different positions on the substrate and connected through a wiring pattern. In this case, it is preferable to form the wiring pattern in a straight line on the end of the chip in order to increase the strength.

A circuit board and an electronic instrument having the circuit board according to the present invention are described below.

Figure 20:
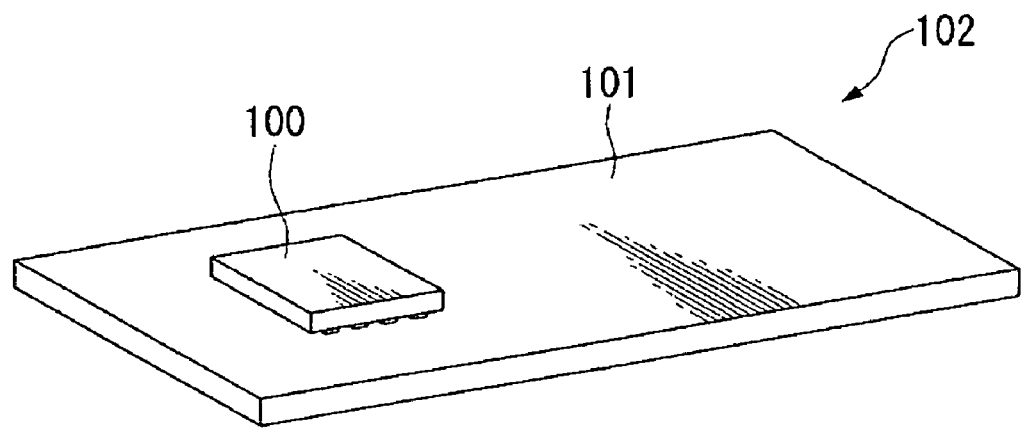
FIG. 20 is a perspective view showing the schematic configuration of a circuit board according to the present invention.

FIG. 20 shows the schematic configuration of a circuit board according to one embodiment of the present invention. As shown in FIG. 20, a circuit board 102 has the configuration in which the semiconductor device 100 is mounted on a substrate 101.

An organic substrate such as a glass epoxy substrate is generally used as the substrate 101. An interconnect pattern is formed of copper or the like on the substrate 101 so that a desired circuit is formed. The interconnect pattern is mechanically connected with the interconnect pattern of the semiconductor device 100, or electrically connected with the interconnect pattern of the semiconductor device 100 using the above-described anisotropic conductive film.

Figure 21:
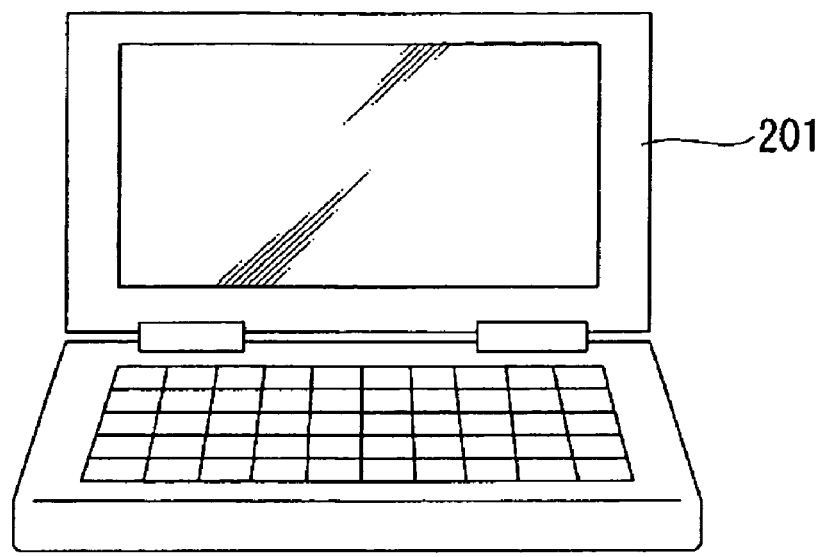
FIG. 21 is a perspective view showing the schematic configuration of an electronic instrument according to the present invention.

FIG. 21 shows a notebook-type personal computer 201 as an electronic instrument having a circuit board including the semiconductor device according to one embodiment of the present invention. The circuit board shown in FIG. 20 is disposed in the casing of the electronic instrument.

The electronic instrument is not limited to the notebook-type computer and the portable telephone. The present invention may be applied to various electronic instruments. For example, the present invention may be applied to an electronic instrument such as a liquid crystal projector, multimedia personal computer (PC) and engineering workstation (EWS), pager, word processor, TV, view finder or direct view finder video tape recorder, electronic notebook, electronic desk calculator, car navigation system, POS terminal, and a device including a touch panel.

What is claimed is:

1. A semiconductor device comprising:
    a substrate on which an electrode is formed; and
    a connection terminal which penetrates the substrate and is conductively connected to the electrode,
    wherein the connection terminal includes:
        a plurality of conductive layers disposed in layers in a direction of the thickness of the substrate;
        a plurality of dielectric connection layers which have a plurality of connection holes, each of the dielectric connection layers being disposed between adjacent two of the conductive layers; and
        conductive materials filled in the connection holes to conductively connect the conductive layers adjacent to each other.

2. The semiconductor device as defined in claim 1, wherein an uppermost conductive layer in the conductive layers of the connection terminal is formed to function as an electrode.

3. The semiconductor device as defined in claim 1, wherein part of the connection terminal projects from a surface of the substrate opposite to the surface on which the electrode is provided.

4. A stacked semiconductor device,
wherein a plurality of the semiconductor devices as defined in claim 1 are stacked with the connection terminal interposed.

5. A circuit board comprising the stacked semiconductor device as defined in claim 4.

6. An electronic instrument comprising the circuit board as defined in claim 5.

7. A circuit board comprising the semiconductor device as defined in claim 1.

8. An electronic instrument comprising the circuit board as defined in claim 7.

9. A semiconductor device comprising:
a substrate on which an electrode is formed; and
a connection terminal which penetrates the substrate and is conductively connected to the electrode,
wherein the connection terminal includes:
a plurality of conductive layers disposed in layers in a direction of the thickness of the substrate; and
a plurality of connection layers which have a plurality of connection holes to conductively connect the conductive layers adjacent to each other, and
wherein as viewed from a direction perpendicular to the substrate, positions of the connection holes in the connection layer do not coincide with positions of other connection holes disposed in another connection layer adjacent to the connection layer.

10. The semiconductor device as defined in claim 9, wherein:
the conductive layers are disposed in layers so that a lower conductive layer is disposed within an upper conductive layer as viewed from a direction perpendicular to the substrate; and
the connection holes in the connection layer are arranged along the periphery of one of the conductive layers which is disposed under the connection layer.

* * * * *